US008149013B2

United States Patent
Kao

(10) Patent No.: US 8,149,013 B2
(45) Date of Patent: Apr. 3, 2012

(54) HIGH SPEED INTEGRATED CIRCUIT

(76) Inventor: Richard F. C. Kao, San Jose, CA (US)

( * ) Notice: Subject to any disclaimer, the term of this patent is extended or adjusted under 35 U.S.C. 154(b) by 0 days.

(21) Appl. No.: 12/459,035

(22) Filed: Jun. 26, 2009

(65) Prior Publication Data

US 2010/0090722 A1 Apr. 15, 2010

Related U.S. Application Data

(63) Continuation of application No. 11/471,294, filed on Jun. 19, 2006, now Pat. No. 7,554,363, which is a continuation-in-part of application No. 10/887,363, filed on Jul. 7, 2004, now Pat. No. 7,102,380, and a continuation of application No. PCT/US2005/021531, filed on Jun. 16, 2005.

(51) Int. Cl.
*H03K 19/094* (2006.01)

(52) U.S. Cl. ........................................... 326/27; 326/83

(58) Field of Classification Search .................... 326/37, 326/38, 46, 101, 102, 82, 83, 86
See application file for complete search history.

(56) References Cited

U.S. PATENT DOCUMENTS

| 6,724,219 | B1 * | 4/2004 | Kim et al. | ........................ 326/30 |
| 6,856,178 | B1 * | 2/2005 | Narayan | ........................ 327/108 |

* cited by examiner

*Primary Examiner* — Don Le

(57) ABSTRACT

A novel driver circuit that uses a differential driver as a design backbone is described. Unlike a conventional differential interface, which typically has two or more outputs for providing an output signal and its complement, one of the differential driver's outputs is coupled to drive an output signal onto a signal line, while another one of the differential driver's outputs is unused and terminated, for instance by coupling the output to package ground or a voltage source via a capacitor. The performance of the driver circuit is significantly improved over conventional singled-ended driver designs.

21 Claims, 36 Drawing Sheets

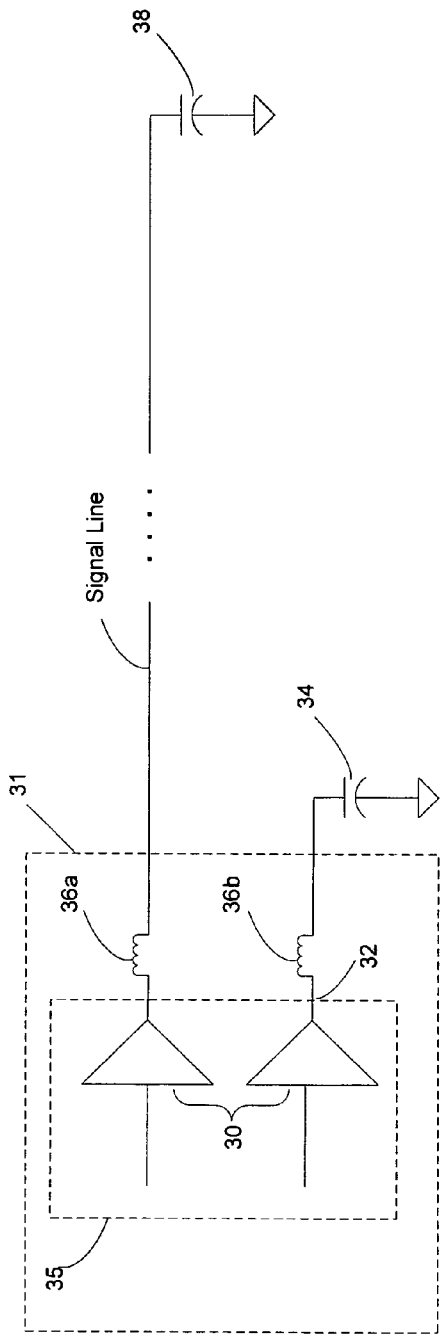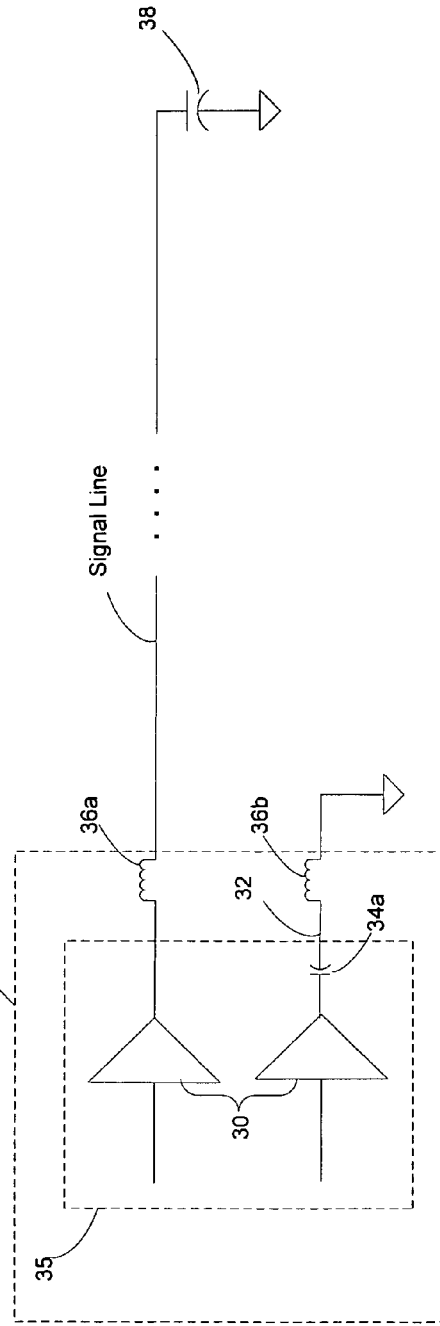

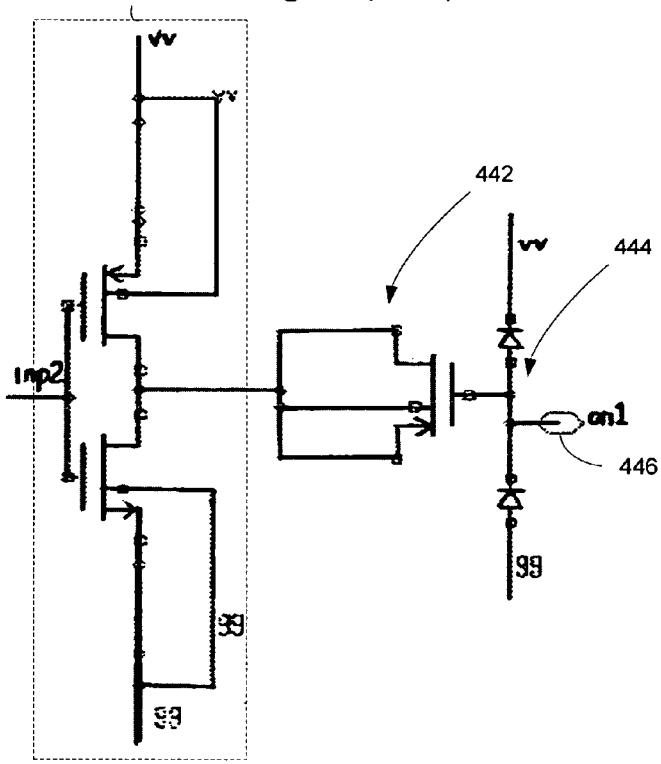
Fig. 4B
Fig. 4C
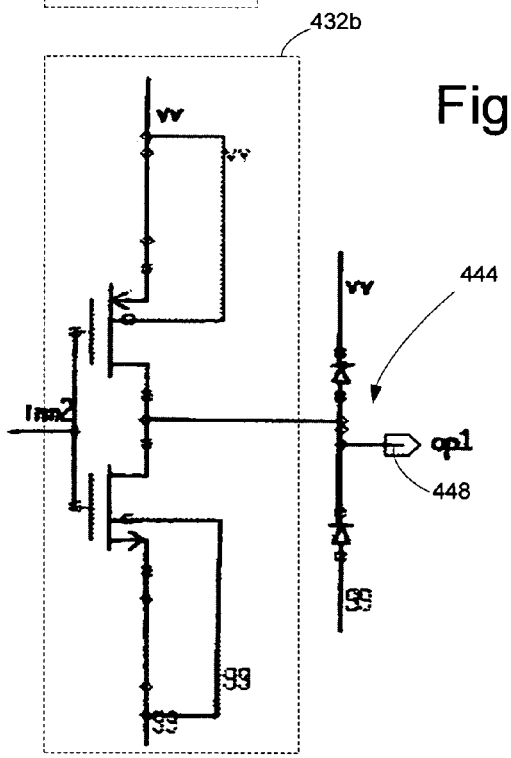
Fig. 4D

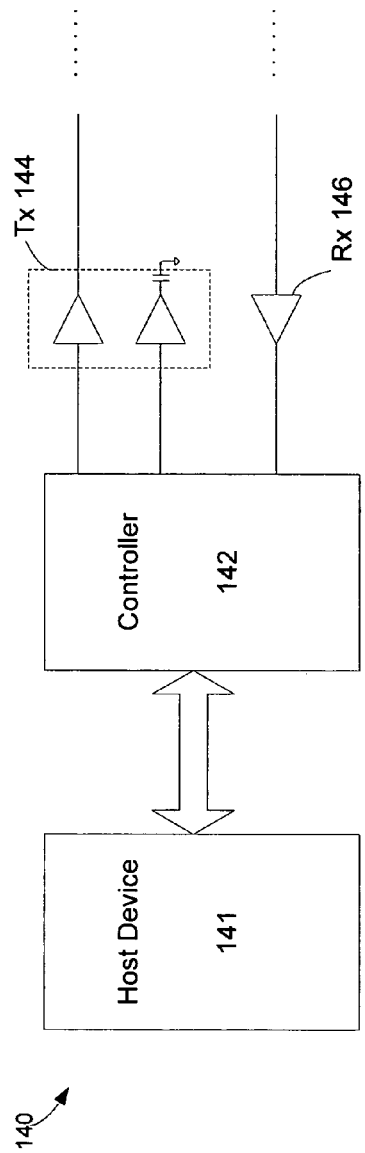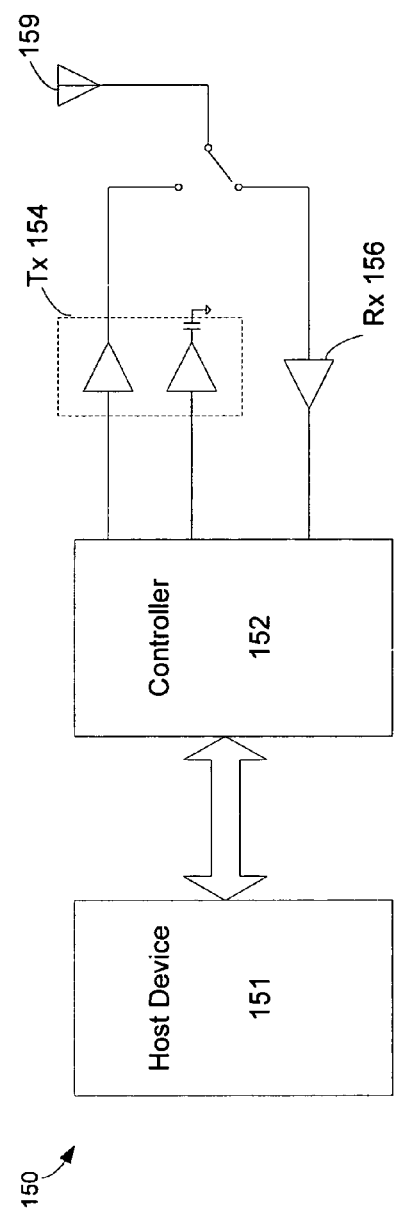

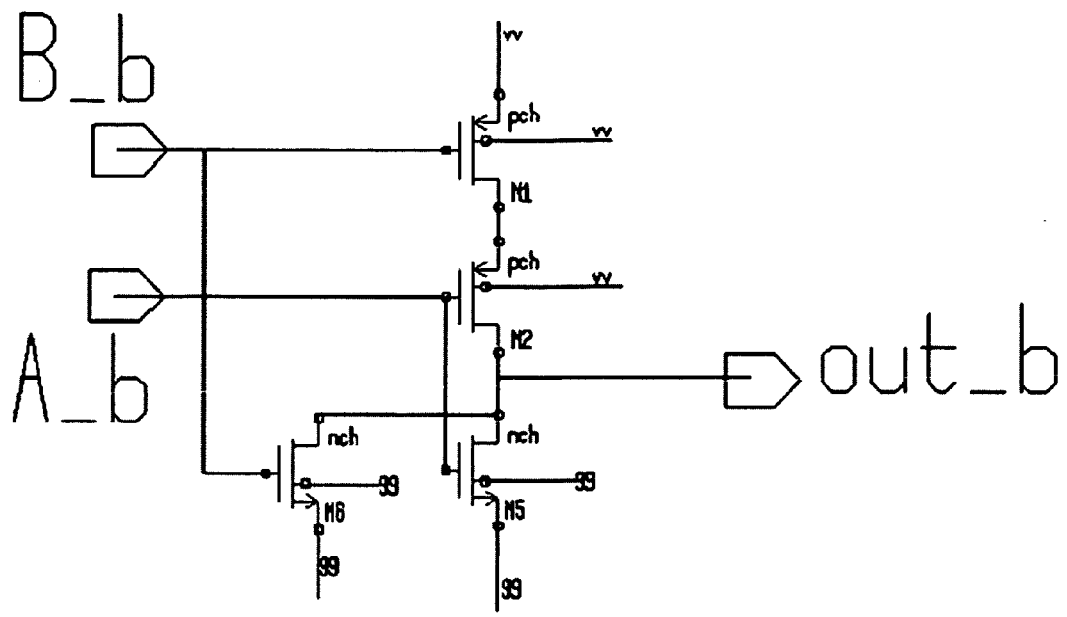
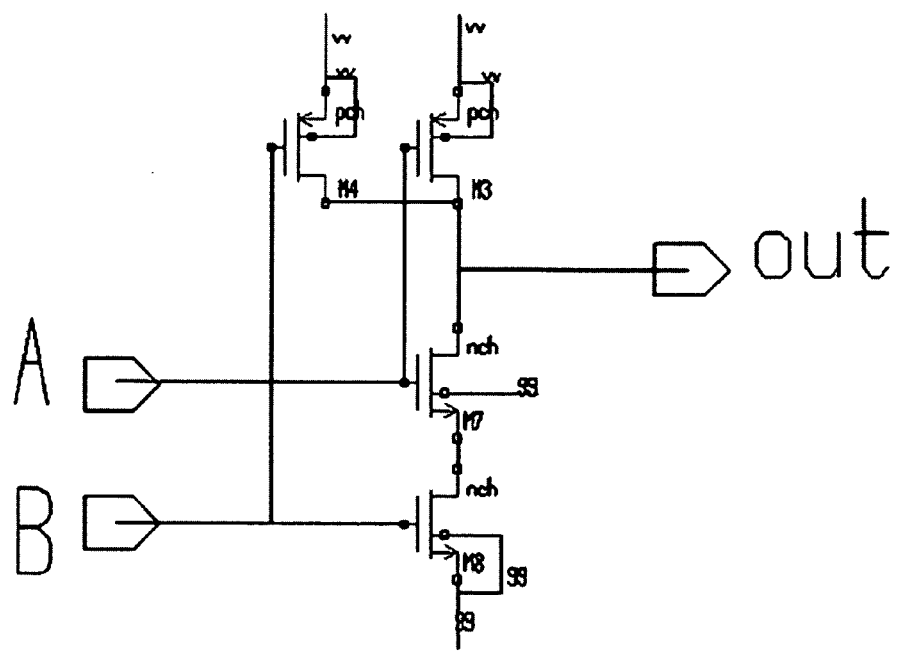
Fig. 18

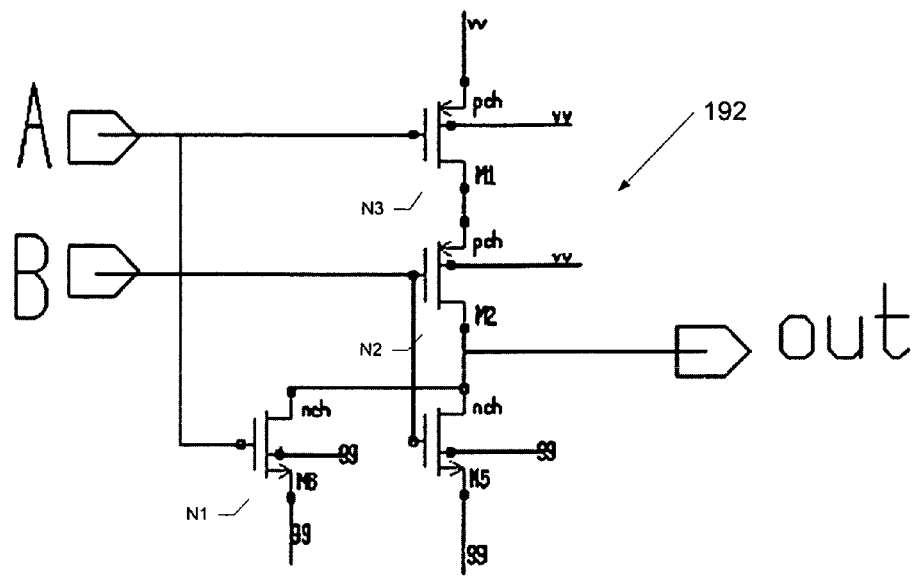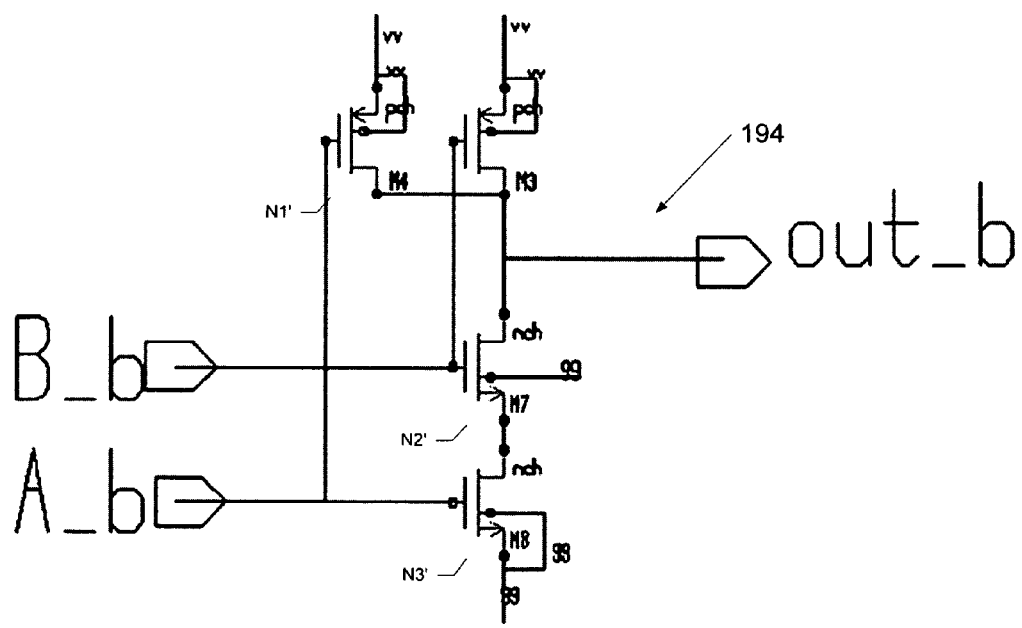
Fig. 19

| | Q1 Q1b Q0 Q0b | D1 D1b D0 D0b |
|---|---|---|
| | 0 0 0 0 | 0 1 0 1 |
| | 0 0 0 1 | 0 1 0 1 |
| | 0 0 1 0 | 0 1 0 1 |
| | 0 0 1 1 | 0 1 0 1 |
| | 0 1 0 0 | 0 1 0 1 |
| 0 | 0 1 0 1 | 0 1 1 0 |
| 1 | 0 1 1 0 | 1 0 0 1 |
| | 0 1 1 1 | 0 1 0 1 |
| | 1 0 0 0 | 0 1 0 1 |
| 2 | 1 0 0 1 | 1 0 0 1 |
| 3 | 1 0 1 0 | 0 1 0 1 |
| | 1 0 1 1 | 0 1 0 1 |
| | 1 1 0 0 | 0 1 0 1 |
| | 1 1 0 1 | 0 1 0 1 |
| | 1 1 1 0 | 0 1 0 1 |
| | 1 1 1 1 | 0 1 0 1 |

$$D0 = \overline{\overline{Q1}*Q1b*\overline{Q0}*Q0b} = Q1+\overline{Q1b}+Q0+\overline{Q0b}$$

$$D0b = \overline{\overline{Q1}*Q1b*\overline{Q0}*Q0b}$$

$$D1 = \overline{\overline{Q1}*Q1b*Q0*\overline{Q0b}} = Q1+\overline{Q1b}+\overline{Q0}+Q0b$$

$$D1b = \overline{\overline{Q1}*Q1b*Q0*\overline{Q0b}}$$

HIGH SPEED INTEGRATED CIRCUIT

RELATED APPLICATIONS

The present application is a continuation of, and claims priority to United States non-provisional patent application bearing Ser. No. 11/471,294, filed Jun. 19, 2006, now U.S. Pat. No. 7,554,363, which is a continuation-in-part of, and claims priority under 35 U.S.C. §120 to United States non-provisional patent application bearing Ser. No. 10/887,363, filed Jul. 7 2004, now U.S. Pat. No. 7,102,380, and which is a continuation of, and claims priority under 35 U.S.C. §§120 and 365(c) to PCT Application bearing application number PCT/US05/21531, filed Jun. 16 2005, and designating multiple countries including the United States. The aforementioned United States patent applications are hereby incorporated by reference in its entirety.

FIELD OF THE INVENTION

The present invention relates generally to digital communication interface designs and high speed circuit designs.

BACKGROUND OF THE INVENTION

A signal line is a conductor used to transmit electrical signals between various devices in an electronic system or between devices located in two separate electronic systems. Output driver circuits contained on each device are used to buffer signals originating from the device so that they may be driven onto the signal lines.

There are well known single-ended output driver circuits (e.g., TTL drivers) that are simple to use. However, most of these previously disclosed driver circuits are not suitable for high speed signals due to their low maximum operating frequency and high noise. For example, the maximum operating frequency of a single-ended CMOS driver circuit IDT74FCT3807D/E, which is available from Integrated Device Technology, Inc. of Santa Clara, Calif., is 166 Mhz. As another example, the maximum operating frequency of a single-ended 1 input to 5 outputs CMOS driver circuit PI49FCT3802, which is available from Pericom Semiconductor Corporation of San Jose, Calif., is 156 Mhz. Other manufacturers such as On Semiconductors, Philips Semiconductors, Integrated Circuit Systems, Inc., also offer similar products that have similar maximum operating frequencies.

For driving high speed signals, differential drivers are often used. A typical differential driver 10 is schematically illustrated in FIG. 1. The differential driver 10 includes data inputs 12a-12b for inputting a differential data signal, and data outputs 14a-14b for providing the differential signal to a differential receiver 16 via signal lines. The arrangement of FIG. 1 is well known to have high operating frequency. However, differential interface designs have disadvantages as well. First, every differential signal requires two or more signal lines. Therefore, a differential I/O interface will require at least twice the number of pins than a single-ended I/O interface, resulting in a larger chip. Furthermore, high speed systems generally require careful matching of the electrical length of the signal lines such that synchronous signals may be received with a common clock and a common phase. This design requirement is sometimes known as "length matching" or "delay matching." A wide differential interface will require a large number of signal lines, necessarily complicating the length matching effort and increasing the cost of manufacture. In some instances, length matching many signal lines may be impossible on tightly packed circuit boards. Thus, at least in some electronic systems, it is not desirable to use differential interfaces.

Accordingly, a single-ended output interface design that communicates single-ended signals at a performance level that is comparable to that of a differential interface may be desirable.

SUMMARY OF THE INVENTION

An embodiment of the invention is a single-ended output interface that uses a differential driver as a design backbone. Unlike a conventional differential interface, which typically has two or more outputs for providing an output signal and its complement, the differential driver of the present embodiment has one of its outputs coupled to drive a signal onto a signal line, while a complementary output is not used for signal transmission. Rather, the complementary output is considered logically redundant and is terminated, for example, by coupling to package ground or system ground via a capacitor. A result of terminating a logically redundant output is that the performance of the output interface may be significantly improved over conventional designs.

In one embodiment of the invention, multiple differential drivers are implemented within an integrated circuit that has a package ground plane. According to this embodiment, each "unused" output of the differential drivers may be terminated at the package ground plane through a capacitor. The package ground plane itself may be coupled to one or more GND pins. In this way, very few pins are needed by the "unused" outputs. Furthermore, only one signal line is needed for each single-ended output signal. In comparison to conventional differential interfaces, where two pins and two signal lines are required for each differential signal, the number of pins and signal lines used by the present embodiment may be significantly smaller.

Another embodiment of the invention is an integrated circuit having a single-ended input and multiple single-ended outputs, for instance a clock driver. Within the integrated circuit, the input signal is first converted into a differential signal. The differential signal is distributed to the multiple differential drivers. Each differential driver may have an output for providing a single-ended output signal and an "unused" output, which terminates one component of the differential signal. Each "unused" output may be coupled to package ground or system ground via a capacitor for the purpose of improving the performance of the other output.

Another embodiment of the invention is an integrated circuit having single-ended inputs and single-ended outputs. The single-ended outputs are implemented using differential drivers each having one output that is "unused." Within the integrated circuit, differential signals may be originated, processed and distributed to the multiple differential output driver circuits. Each differential driver may have an output for providing a single-ended output signal and an "unused" output. The "unused" output of each differential driver may be coupled to package ground or system ground via a capacitor for the purpose of improving the performance of the other output. Circuits that process differential signals within the integrated circuits may be implemented with differential standard cells in accordance with some embodiments of the invention.

Yet another embodiment of the invention is an integrated circuit having a logic core and a plurality of output pads or I/O pads coupled to the logic core. The output pads or I/O pads may include circuits for receiving single-ended signals from the logic core, converting the single-ended signals into differential signals, and providing one component of each differential signal as a single-ended output signal. Another component of each differential signal is terminated, for example, by coupling to package ground or system ground via a capacitor.

Yet a further aspect of the invention provides a method of designing a high speed circuit. According to this aspect of the invention, a logic-level schematic for a first circuit is converted to a transistor level schematic. A complementary circuit is designed and added to the transistor level schematic. The complementary circuit, in one embodiment, performs a logic function that is complementary to the logic function of the first circuit and has a same number of nodes as the first circuit. Furthermore, the nodes in the complementary circuit are complementary to the corresponding nodes in the first circuit. In addition, the rise/fall time of each node in the first circuit matches the fall/rise time of a corresponding node in the complementary circuit. The trace length between certain nodes of the complementary circuit may have to match the trace length between corresponding nodes of the first circuit. The pull-up and pull-down currents at the appropriate nodes of the first circuit may have to match the currents at the corresponding nodes at the complementary circuit. The resulting circuit design is called a "differential circuit," which is capable of operating at a clock speed significantly higher than the clock speed at which the first circuit is capable of operating. The resulting transistor level schematic, which may include twice the transistors than the original transistor level schematic, is then converted to a logic-level schematic for the differential circuit. According to one embodiment of the invention, the logic-level schematic for the differential circuit is sometimes called a "voltage mode" differential cell."

According to one embodiment, the "voltage mode" differential cell design methodology according to this aspect of the invention is applicable to the design of digital logic circuits (e.g., CMOS circuits), analog circuits, and/or mixed signal circuits.

BRIEF DESCRIPTION OF THE DRAWINGS

The invention will now be described with reference to the accompanying drawings which illustrate various example embodiments of the invention. Throughout the description, similar reference names may be used to identify similar elements.

FIGS. 3A-3F depict examples of various embodiments of the invention.

FIGS. 4A-4D depict an example implementation of a circuit in accordance with an embodiment of the invention.

FIG. 14 depicts a high speed serial bus system that may be implemented according to an embodiment of the invention.

FIG. 15 depicts a high speed wireless communication system that may be implemented according to an embodiment of the invention.

FIG. 18 is a diagram depicting an example transistor-level implementation a differential NOR gate of FIG. 12B.

FIG. 19 is a diagram depicting an example transistor-level implementation a differential NAND gate of FIG. 12A.

DETAILED DESCRIPTION OF PREFERRED EMBODIMENTS

Various features of the invention, including specific implementations thereof, will now be described. Throughout the description, the term "differential signal" refers to a signal that is carried by more than one signal lines, and thus a differential signal includes two or more component signals that may be complementary to each other. If the sum of two time-varying signals always approximately equals a constant value, such as zero, the signals are said to be "complementary" to each other. The term "single-ended signal" refers to a signal that is carried by a single signal line. Furthermore, the terms "driver" and "driver circuit" are used synonymously.

Throughout the description, the term "unused output" refers to an output of a differential output driver that is not used to provide a signal to a receiver, or one that is not used to drive a signal line. The term "unused output" may also refer to an output of a differential output driver that may be coupled to package ground, system ground, voltage source, etc., via a capacitor. Additionally, the term "unused output" may refer to an output of a differential output driver that drives a component of a differential signal to package ground, system ground, voltage source, etc., via a capacitor. An "unused signal" herein may refer to a signal that is provided by an unused output and that is not provided to a signal receiver. A more specific meaning for the above terms may be inferred by context.

Furthermore, the terms "couple" and "coupled" may describe a direct or an indirect connection. For example, a node may be connected to one end of a capacitor, and another end of the capacitor may be connected to system ground. The node is said to be "coupled" to system ground even though the connection is an indirect one.

The various features of the invention set forth herein may be embodied within a wide range of integrated circuits including, but not limited to, signal drivers, clock drivers, oscillators (e.g., ring oscillators, crystal oscillators), serial bus drivers, ethernet drivers, optical transmitters, memory controllers, memories, microprocessors, wireless transmitters, and power amplifiers, some of which may be found in computer systems and wireless devices (e.g., laptop computers, wireless telephones and personal digital assistants). Also, it should be understood that some implementations described herein may be specific to CMOS technology and that features of the invention may be applicable to other integrated circuit technologies as well.

Figure 1:
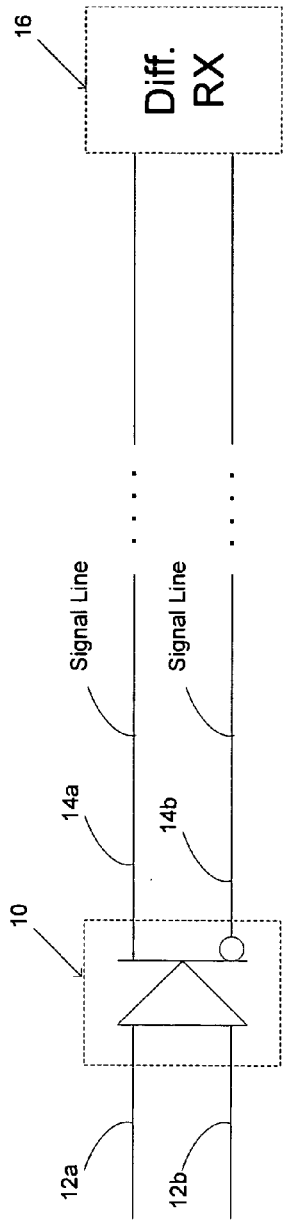
FIG. 1 depicts a differential driver.
Figure 2:
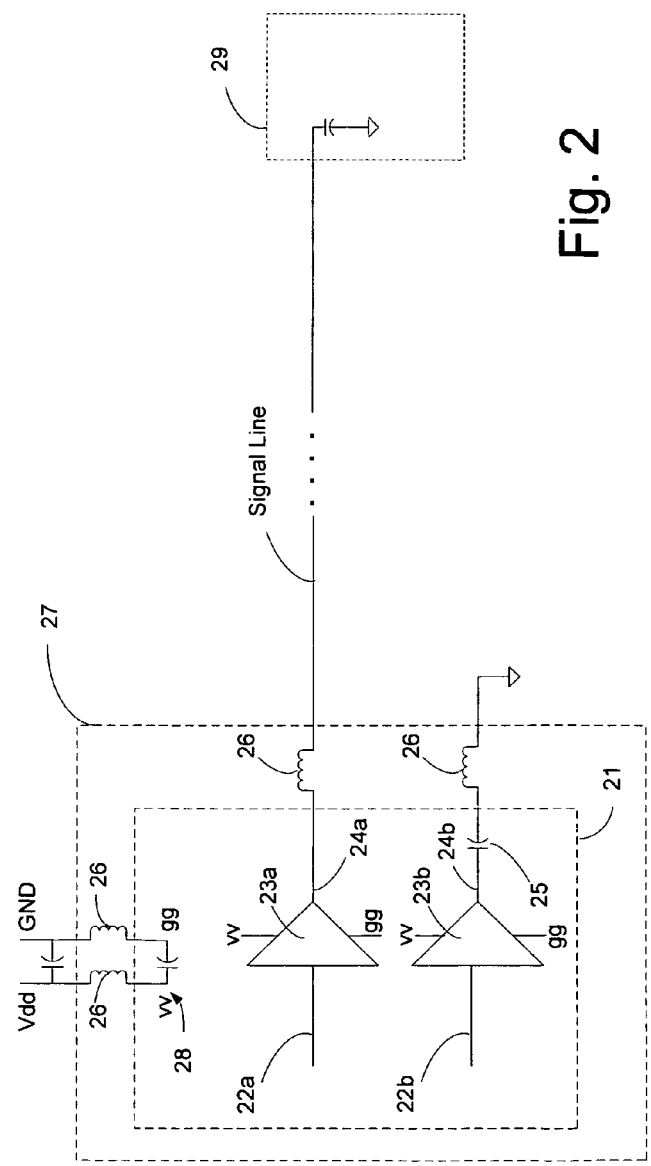
FIG. 2 depicts an output driver circuit that uses a differential driver as a backbone according to an embodiment of the invention.

Referring to FIG. 2, there is schematically illustrated an output driver circuit in accordance with an embodiment of the invention. The output driver circuit includes inputs 22a-22b for receiving a differential signal, and drivers 23a-23b for providing the differential signal through outputs 24a-24b. According to an embodiment of the invention, the differential signal includes two complementary signal components. Note that driver 23a drives one of the complementary signals as a single-ended output signal to receiver 29 via a signal line. The other one of the complementary signals is unused and is terminated, for instance by coupling the output 24b to system ground (GND) via a capacitor 25. As a result of terminating the unused signal, which is considered logically redundant to and inverse of the "used" signal, the performance of the output driver circuit may be significantly better than those of conventional single-ended driver designs.

In a preferred embodiment, the driver 23a and driver 23b are connected to the same voltage source and the same ground. In one embodiment of the invention, the circuit in FIG. 2 may be implemented using TTL-CMOS, which may minimize static current requirement and provide high power output. For example, a TTL-CMOS circuit according to the invention may have a static current that is close to zero (e.g., 0.1 μA) and may have a power output of 3 V or more. A power output of 3 V or more is significantly higher than the power output of an LVDS (Low Voltage Differential Signaling) differential driver, which is typically about 350 mV. Thus, the invention may allow one to achieve high frequency without compromising performance for low static current and high output power.

Also depicted in FIG. 2 are die 21, package 27, and inductors 26 representative of the inductance associated with the bonding wires of the package 27. Also shown in FIG. 2 is a decoupling capacitor 28. The decoupling capacitor 28 may be located on the die 21, outside the die 21 but inside the package 27, or outside the package 27.

According to one embodiment of the invention, the unused output of the driver 23b may be terminated inside or outside the package, and the capacitor 25 may be placed inside the die 21, outside the die 21 but within the package 27, or outside the package 27. Furthermore, the capacitor 25 may be coupled to a voltage source, such as Vcc, or any pre-determined voltage.

FIGS. 3A-3F depict several ways of terminating the unused output. In light of the disclosure herein, one of ordinary skill in the art would appreciate that many other ways of terminating unused outputs are within the scope of the principles of the invention disclosed herein. For instance, in embodiments where a capacitor is illustrated, one of ordinary skill in the art would appreciate that an inductor and/or resistor may be used in combination with or in lieu of the capacitor, depending on the application and loading. Many other combinations and permutations of resistance, capacitance and inductance values and their locations are possible.

FIG. 3A schematically depicts an output driver circuit according to an embodiment of the invention. The output driver circuit includes a differential driver 30 that is configured to receive a differential signal. Unlike outputs of conventional differential drivers, one output of the differential driver 30 provides a single-ended output signal to a signal line, and another output 32 is unused and is terminated. As shown in FIG. 3A, a capacitor 34 couples the unused output 32 to GND. In one embodiment, the capacitor 34 may have the same capacitance as the load, which is represented by capacitor 38 and which is typically a signal I/O receiver. In one implementation, the capacitance of capacitor 34 may be approximately half-way between the maximum loading capacitance and minimum loading capacitance of the integrated circuit, and the capacitance may vary depending on application. In another implementation where the output load capacitor 38 has a maximum value of about 15 pf, the capacitance of the capacitor 34 is preferably between approximately 5 pf to approximately 13 pf. In the embodiment shown in FIG. 3A, the capacitor 34 is implemented outside the die 35 and the chip package 31, for instance on a printed circuit board (PCB). Also shown in FIG. 3A are inductors 36a-36b, which represent the inductance within the package 31.

FIG. 3B schematically depicts a differential driver 30 whose unused output 32 is terminated outside the package 31 via a capacitor 34a and an inductor 36b. Note that in this embodiment the capacitor 34a is located on the same die 35 as the differential driver 30. As in the embodiment shown in FIG. 3A, the capacitor 34a may have the same capacitance as the load. In one implementation, its capacitance may be approximately 5-13 pf. Note that this capacitance may vary depending on the application.

Figure 3C:
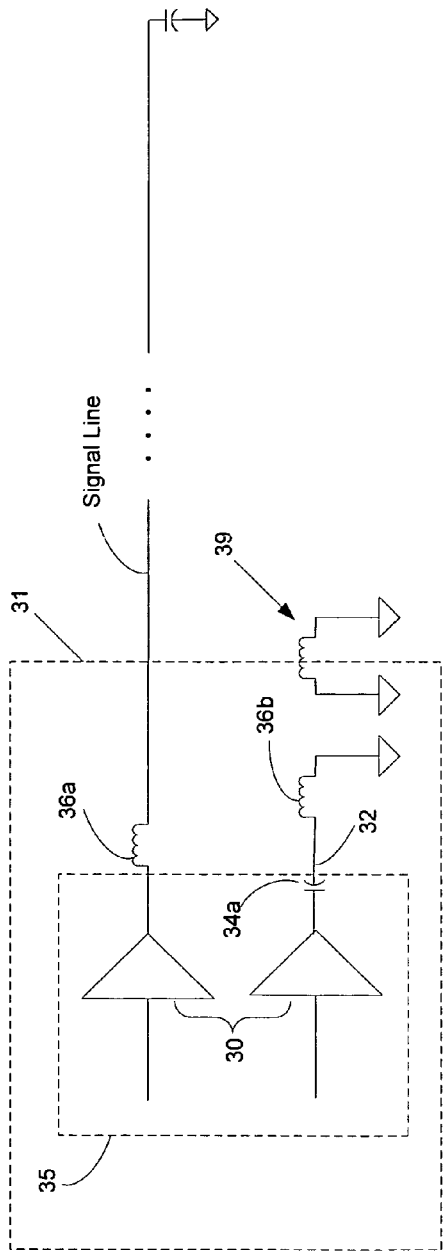

FIG. 3C schematically depicts a differential driver 30 whose unused output 32 is terminated inside the package 31, in accordance with an embodiment of the invention. In this embodiment, the unused output 32 is terminated at a ground plane of the package 31. The ground plane is in turn coupled to an external ground (e.g., system ground) via a connector or pin 39.

Figure 3D:
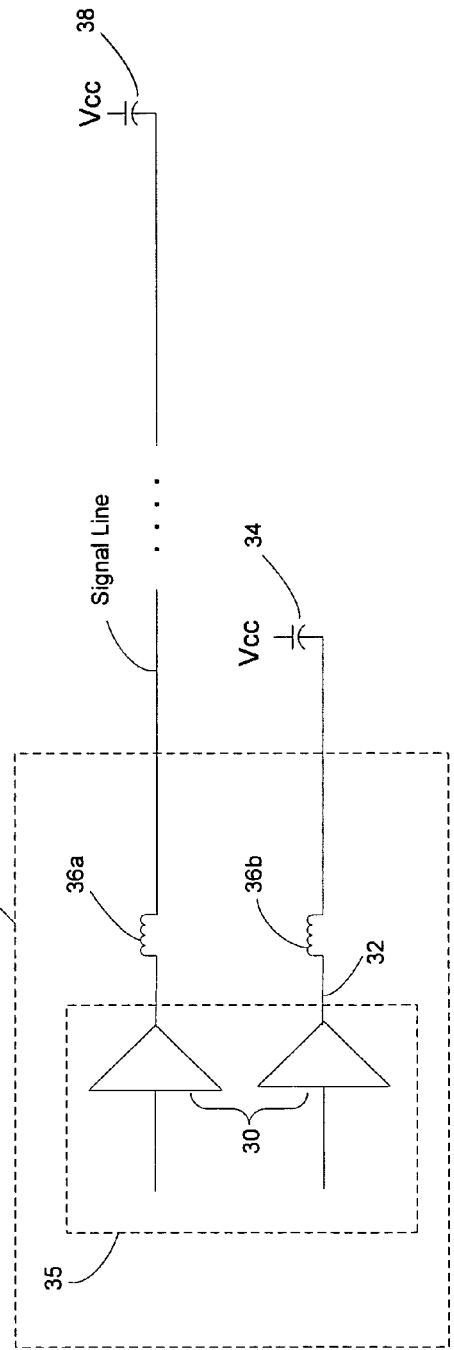

FIG. 3D schematically depicts another embodiment of the invention. In this embodiment, the unused output 32 of the differential driver 30 is coupled to an external voltage source Vcc via a capacitor 34. Note that in this embodiment, the load is coupled to Vcc as well.

Figure 3E:
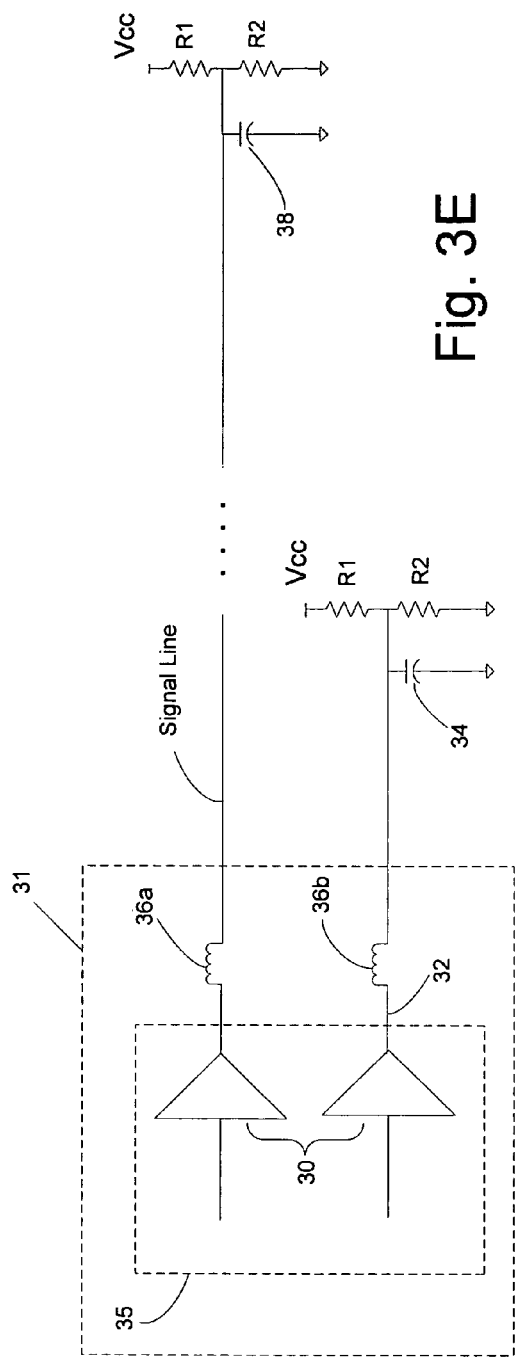

FIG. 3E schematically depicts yet another embodiment of the invention. In this embodiment, the unused output 32 of the differential driver 30 is terminated at a pre-determined voltage via a capacitor 34. Note that in this embodiment, the load is coupled to the same pre-determined voltage as well.

Figure 3F:
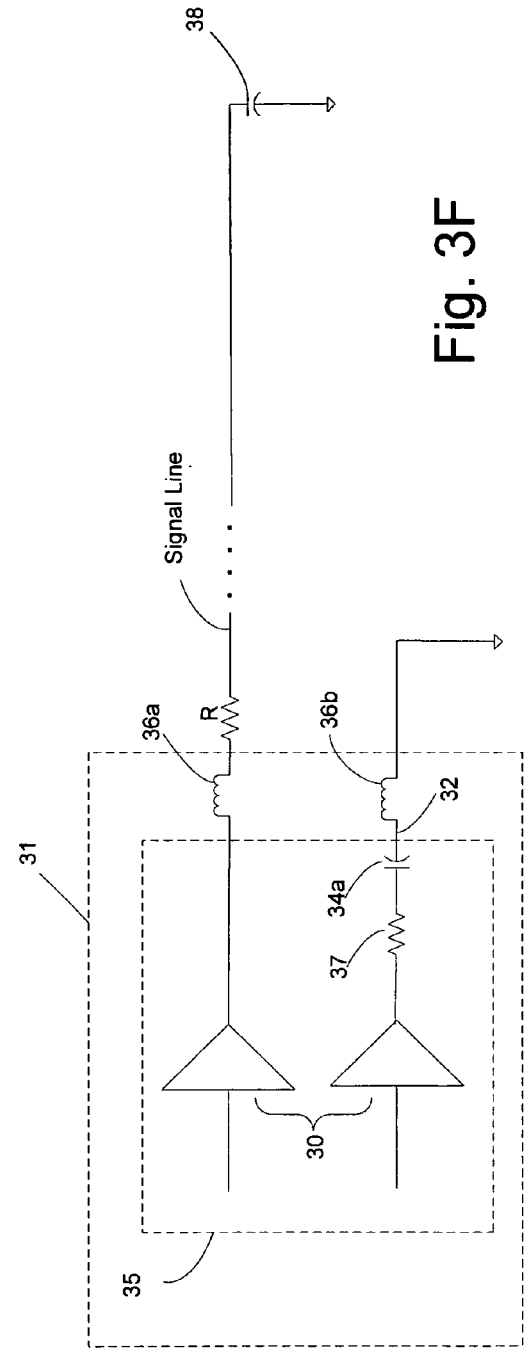

FIG. 3F schematically depicts yet another embodiment of the invention. In this embodiment, capacitor 34a and resistor 37 are located on die 35. Preferably the resistor 37 may have approximately the same resistance as the series resistor R on the signal line. The series resistor R may be implemented to suppress the reflection signal on the signal line.

It should be noted that the output driver circuits and the receivers may not necessarily be implemented within the same system. In other words, the signal lines connecting the output driver circuits and the receivers are not limited to signal traces of a printed circuit board (PCB). The output driver circuits according to the present invention may be used to drive signals across cables (e.g., CAT-6 cables) or other types of electrical connections. According to one embodiment, the output driver circuit may drive signals that have a large voltage swing. Thus, the signals may be carried for a large distance. Furthermore, in some embodiments, the signal lines may not be strictly electrical connections. Rather, a signal line may be any signal path, which may include electrical connections, optical connections, wireless connections, and/or any other type of conduits, and/or any combination thereof.

Referring now to FIGS. 4A-4D, there is shown schematically an example implementation of a circuit according to an embodiment of the invention. In FIGS. 4A-4D and other drawings, "gg" indicates chip ground, and "vv" indicates chip voltage Vdd. This illustrated implementation may be subdivided generally into three stages. The first stage 410, which includes inverter 412 and transmission gate 414, converts the input signal into a differential signal. Naturally, the inverter 412 causes a small signal propagation delay. A function of the transmission gate 414 is to provide sufficient delay such that the resulting differential signal has complementary components. In an alternate embodiment, the transmission gate 414 may be replaced by an appropriate RC circuit. In that embodiment, the RC circuit may have RC characteristics that generally match those of the inverter 412.

Figure 4A:
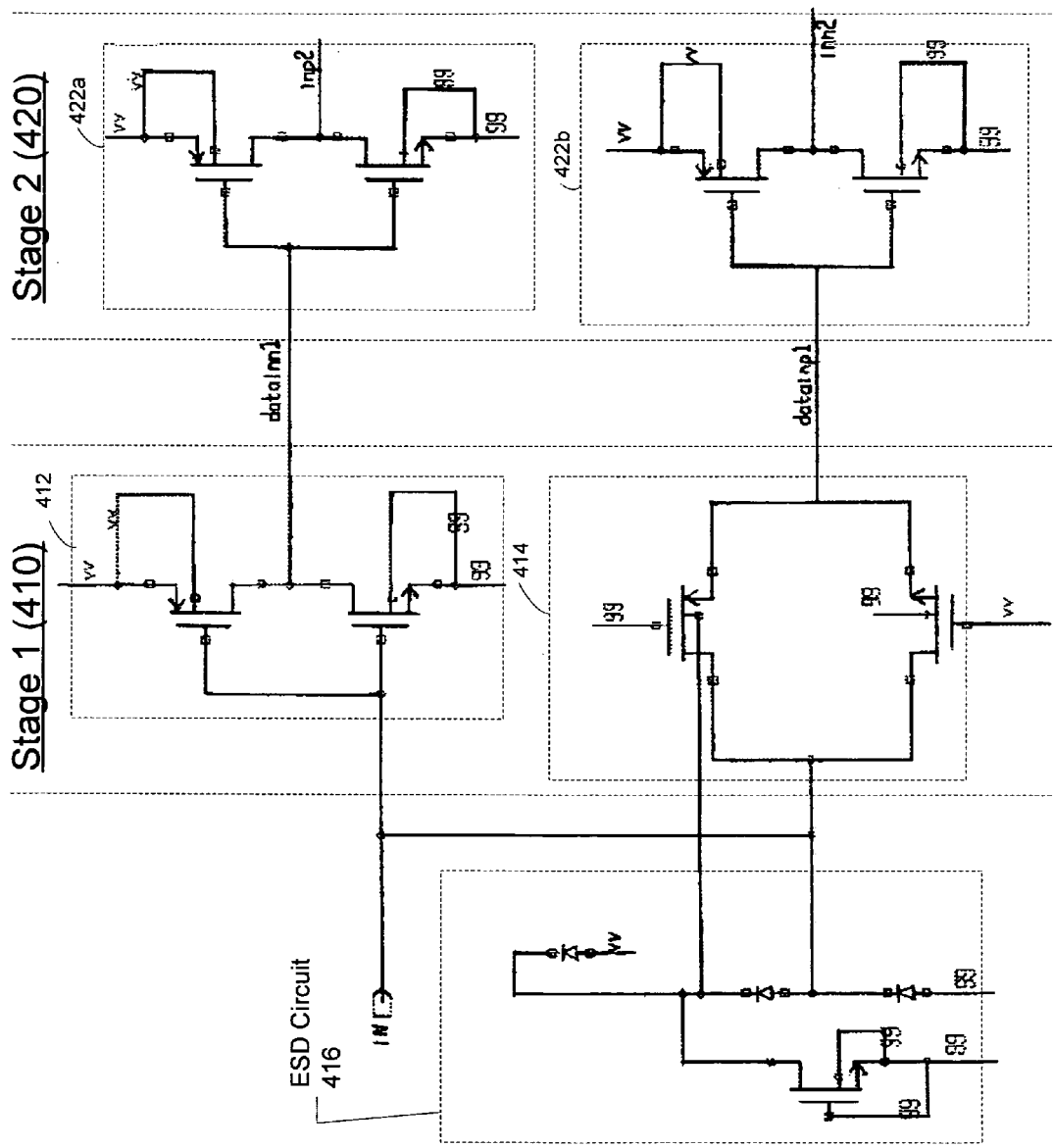
Figure 13A:
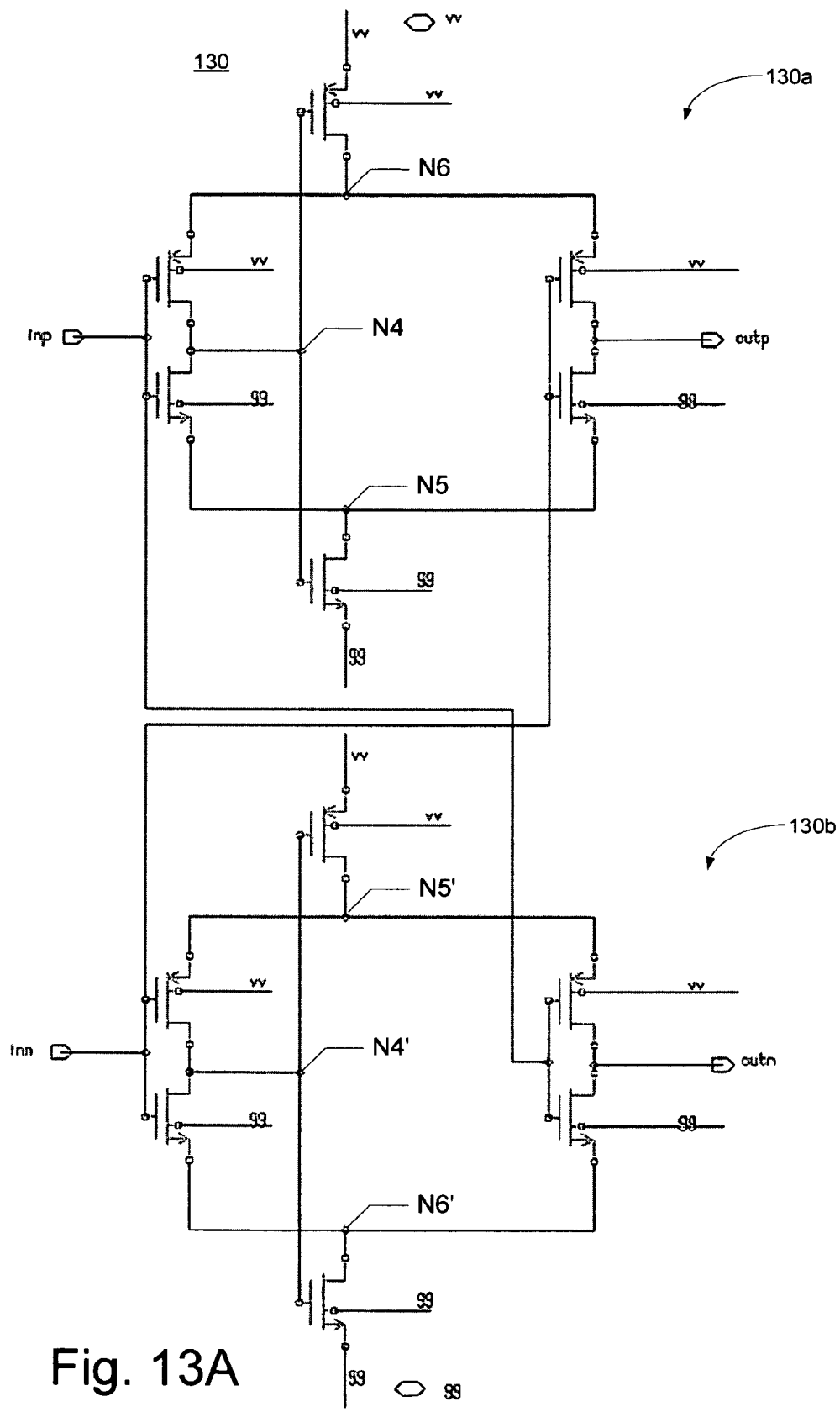
FIG. 13A depicts a voltage-mode differential comparator that may be used in another example implementation of an output driver circuit in accordance with an embodiment of the invention.

With reference still to FIG. 4A, the first stage 410 may be coupled to an electrostatic discharge (ESD) circuit 416 that protects the input circuit from electrostatic discharge. Also note that in this variation the ESD circuit 416 utilizes the transmission gate 414 to provide the ESD protection function. The ESD circuit 416 further provides a 5V I/O tolerant function when the overall circuit is driven by 3 V to 3.6 V. Furthermore, the first stage 410 may include a differential comparator circuit, an example of which is shown in FIG. 13A (described further below), for receiving differential signals.

The second stage 420 includes two inverter circuits 422a-422b coupled to inverter 412 and transmission gate 414, respectively, to receive the differential signal. Note that the second stage 420 is optional. In another embodiment of the invention, outputs of the first stage 410 may connect directly to inputs of the third stage 430. In other embodiments, the second stage 420 may include any differential logic circuit. For instance, the second stage 420 may include differential latches, differential flip-flops, etc., in place of the inverter circuits 422a-422b.

According to an embodiment of the invention, the second stage 420 may include circuits capable of processing differential or complementary signals. These circuits may be implemented with a plurality of differential standard cells that have differential inputs and differential outputs. Examples of some differential standard cells of the invention are illustrated in FIGS. 12A-12G, which are described further below.

It should be appreciated by one skilled in the art having the benefit of the present disclosure that the differential standard cells of the invention are different from previously disclosed differential circuits such as differential current mode logic. For instance, current mode logic circuits have static currents (and current sources), and thus they are not suitable for VLSI implementation. In contrast, circuits built according to the differential standard cells of the invention may not have static currents (except for leakage current), and thus they are suitable for VLSI implementation. It should also be appreciated by one skilled in the art having the benefit of the present disclosure that the differential standard cells shown in FIGS. 12A-12G and FIG. 13A (described below) do not represent an exhaustive list, and that many other differential standard cell designs consistent with the principles of the invention are possible and are within the scope of the invention. Since the differential standard cells are not using current source, the term "voltage mode" is used herein to describe the differential standard cells and to distinguish them from current mode logic.

The third stage 430, which is shown in FIG. 4B, may include multiple inverter circuits although only two inverter circuits 432a-432b are illustrated. In this embodiment, the inverter circuits 432a-432b are coupled to the inverter circuits 422a-422b (FIG. 4A), respectively. In other embodiments, the connections may be swapped. That is, the inverter circuit 432a may be coupled to inverter circuit 422b, and inverter circuit 432b may be coupled to inverter circuit 422a.

The third stage 430 further includes transistor 442, which acts as a capacitor, and ESD Diodes 444. According to an embodiment of the invention, the inverter circuit 432a provides the "unused output" of the differential driver of FIGS. 4A-4B. According to one embodiment of the invention, the output 446 is coupled to ground plane of an integrated circuit package such that the output 446 may be coupled to GND when the integrated circuit is in operation. The output 448 may be coupled to an output pin of the integrated circuit such that the output 448 may drive a signal line when the integrated circuit is in operation.

FIG. 4C depicts a decoupling capacitor 440, and FIG. 4D depicts an ESD protection circuit 450. Both the decoupling capacitor 440 and the ESD protection circuit 450 may be part of the same integrated circuit as the output driver circuits. The decoupling capacitor 440 is for providing a clean voltage source and ground within the die, and the ESD protection circuit 450 is for protecting the circuits from electrostatic damage. Other circuitry may be implemented as part of the integrated circuit as well. The capacitance of the decoupling capacitor 440 can be very small or very large and may vary from one implementation to another as long as it is capable of providing a clean voltage source and ground within the die.

According to an embodiment of the invention, the circuits of FIGS. 4A-4D are implemented using CMOS technology. PMOS transistors shown in FIGS. 4A-4B have the following device parameters: m=4, w=80 μm, L=0.35 μm (except PMOS transistors 442). NMOS transistors shown in FIGS. 4A-4B have the following device parameters: m=4, w=40 μm, L=0.35 μm. PMOS transistor 442 has the following device parameters: m=3, w=46.5 μm, L=12.9 μm. The NMOS transistor 440 (FIG. 4C) has the following device parameters: m=3000, w=30 μm, L=20 μm. The NMOS transistor 450 (FIG. 4D) has the following device parameters: m=8, w=40 μm, L=0.35 μm. These implementation details are provided for completeness purposes only and such details should not be construed to limit the scope of the invention. Embodiments of the present invention may be implemented in many other ways using different technologies, different types of transistors and different device parameters.

Referring now to FIG. 13A, there is shown a "voltage mode" differential comparator 130 that may be used as an alternative to circuits 412 and 414 of FIG. 4A. The circuits 412 and 414 are configured to receive a single-ended input signal and to convert the single-ended input signal into a differential signal. Unlike circuits 412 and 414, the differential comparator 130, which includes comparator circuits 130a-130b, is configured to receive a differential signal and provide the comparison result and its complement (or inverse) to other circuits, for instance circuits 422a and 422b. According to an embodiment of the invention, the differential comparator circuit 130 may be used for receiving differential signals originated from another portion of the integrated circuit or outside of the integrated circuit. The differential comparator circuit 130 may be used also for receiving LVDS, LVPECL, HSTL and other differential signals that have a small voltage swing. In some embodiments where the differential signals have large voltage swings, the differential signals may be fed directly to circuits of the second stage 420 or the third stage 430.

Figure 5:
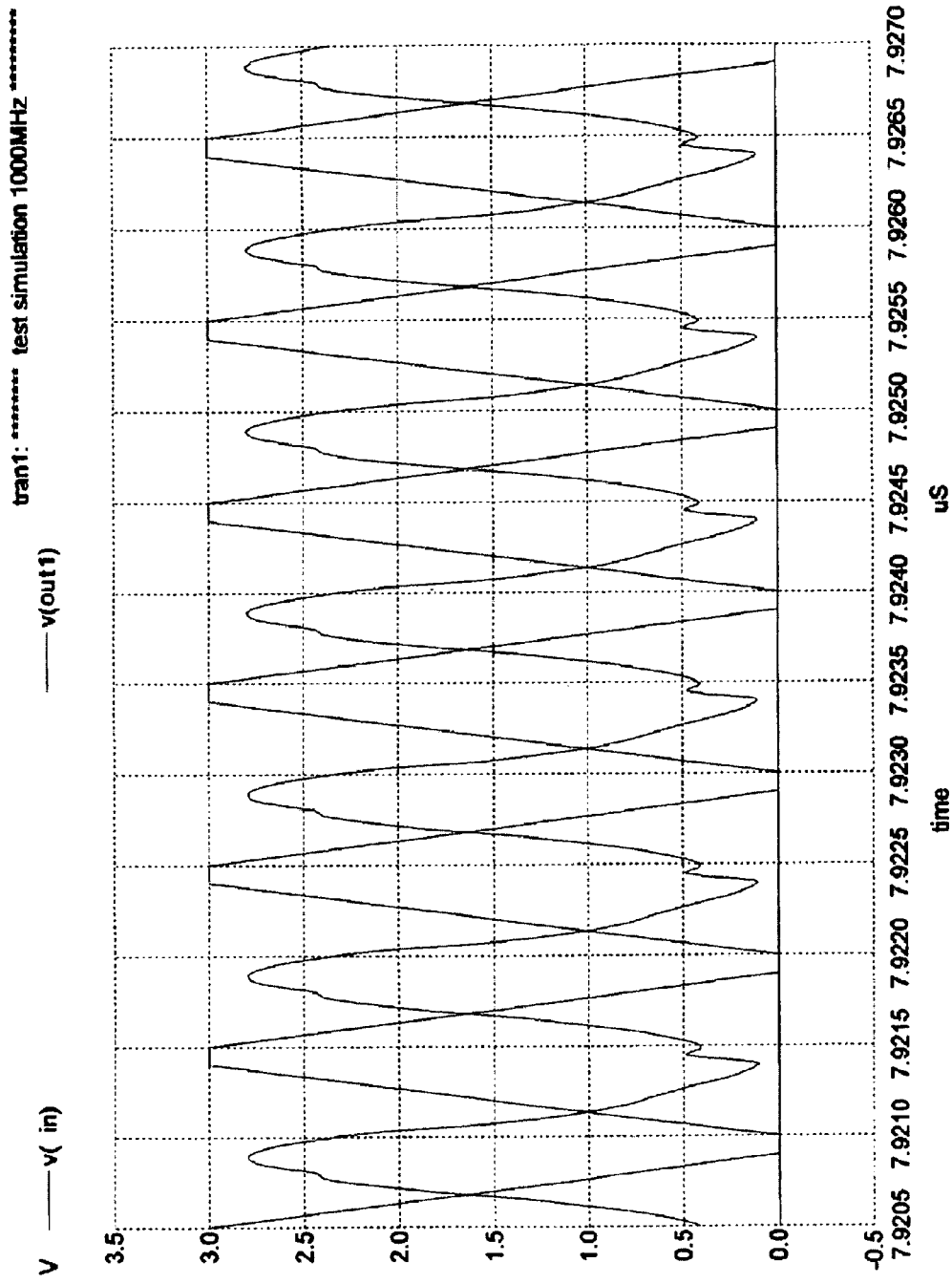
FIG. 5 depicts simulation results of the output interface design of FIGS. 4A-4B.

Attention now turns to FIG. 5, which depicts simulation results of the output driver circuit design of FIGS. 4A-4D. The simulation results are obtained by using TSMC 0.35 μm BSIM-3 spice model. The output frequency of approximately 1 Ghz is achievable with a 5 pf load. In an actual implementation, the output frequency of approximately 1 Ghz is achievable with a load of approximately 2 pf from a single-ended 1 input to 5 outputs CMOS driver circuit. For the purposes of illustration, the maximum operating frequency of a pin-to-pin compatible single-ended 1 input to 5 outputs CMOS driver circuit PI49FCT3802, which is available from Pericom Semiconductor Corporation of San Jose, Calif., is 156 Mhz.

Figure 6:
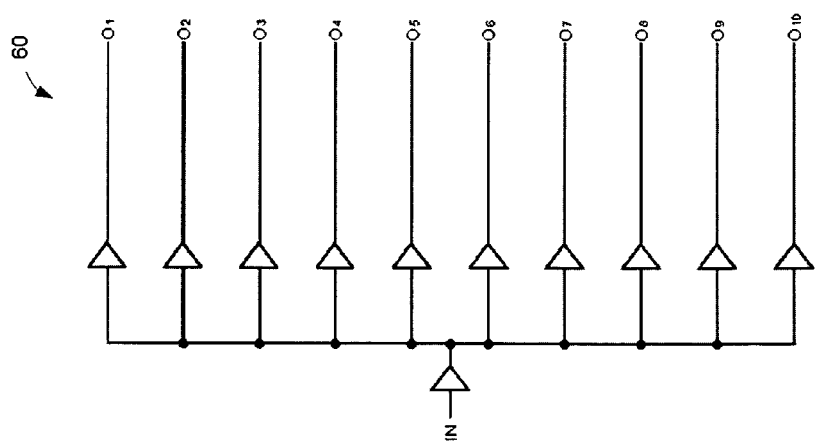
FIG. 6 depicts a schematic of a known clock driver circuit.

Referring now to FIG. 6, there is shown a schematic of a known CMOS clock driver integrated circuit 60, an example of which is an integrated circuit bearing model number IDT74FCT3807D/E, which is available from Integrated Device Technology, Inc. of Santa Clara, Calif. As shown, this clock driver circuit has an input for receiving a clock signal, and ten outputs for distributing the clock signal to ten devices. According to a published specification from the manufacturer, the maximum operating frequency of the aforementioned clock driver circuit is 166 Mhz. In many applications, an operating frequency higher than 166 Mhz is often desired.

Figure 7:
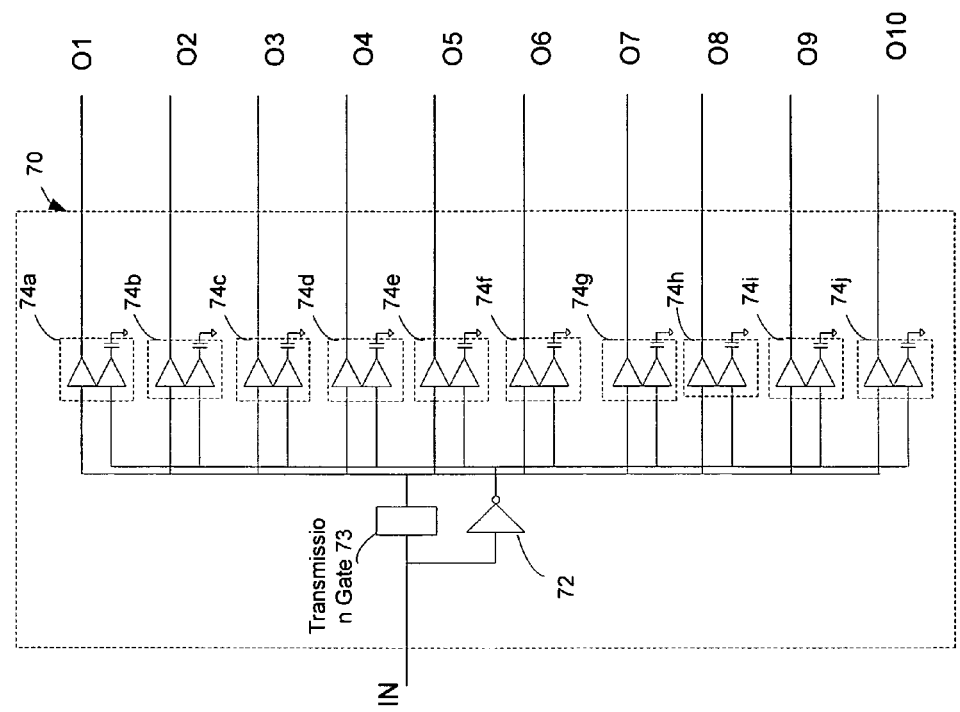
FIG. 7 depicts a schematic of a clock driver circuit according to an embodiment of the invention.

FIG. 7 depicts a schematic of a clock driver integrated circuit 70 according to an embodiment of the invention. As shown the clock driver circuit includes an input inverter 72 and a transmission gate 73 for receiving an input signal, and output drivers 74a-74j for providing multiple output signals. Note that, although the input signal and the output signals are single-ended signals, differential signals are communicated within the integrated circuit to the output drivers 74a-74j. As shown in FIG. 7, the input inverter 72 and the transmission gate 73 convert the input signal into a differential signal and provide the differential signal to the output drivers 74a-74j. Furthermore, output drivers 74a-74j each have an unused output such that one component of each output differential signal is not transmitted. According to the present embodiment, the clock driver integrated circuit may achieve an operating frequency of 1 Ghz by using a 0.35 μm CMOS process technology. This performance level is significantly higher than the maximum performance level of the conventional CMOS clock driver shown in FIG. 6. In light of the disclosure herein, one of ordinary skill in the art would appreciate that the circuit shown in FIG. 7 may be implemented with other semiconductor technologies, such as 0.25, 0.18, 0.09 μm processes and/or GaAs, BiCMOS, and BJT processes, which may further enhance the frequency performance of the circuit.

In one embodiment of the invention, multiple differential drivers are implemented within in an integrated circuit. In this embodiment, the unused output of each differential driver may be coupled to an external ground (e.g., system ground) via individual GND pins. However, in some applications having an individual GND pin for each output driver circuit may be undesirable because the increased number of pins may increase the size and cost of the integrated circuit.

In another embodiment of the invention, multiple unused outputs may be coupled together to a package ground plane of the integrated circuit. The package ground plane is coupled to one or more GND pins, which are designated to be coupled to an external ground (e.g., system ground). In other words, one or more GND pins may be shared by all the unused outputs of the output driver circuits. In this way, a single GND pin may support a wide output interface.

Figure 8:
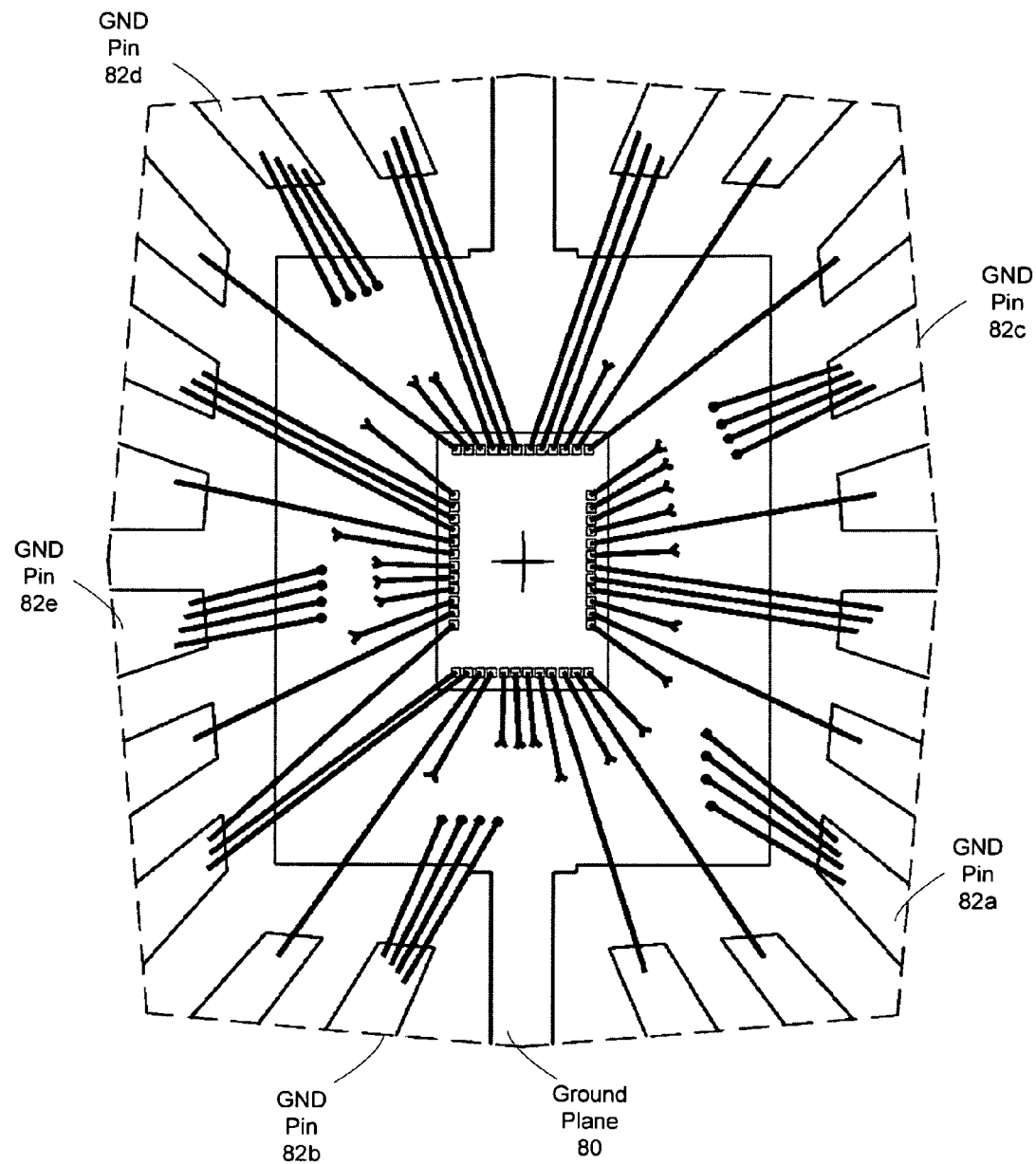
FIG. 8 depicts an integrated circuit package where unused outputs of the differential drivers are coupled to the common ground plane, in accordance with an embodiment of the invention.

An integrated circuit package 84 where unused outputs of the output driver circuits are coupled to a package ground plane is depicted in FIG. 8. As illustrated, multiple bond wires connect the bond pads that correspond to the unused outputs of the output driver circuits to the Ground Plane 80, which is itself connected to GND Pins 82a-82e via other bond wires. Note that GND Pins 82a-82e are not designated for signal transmission purposes but are designated to be coupled to ground.

In another embodiment of the invention, unused outputs of the output driver circuits may be coupled together to a common node within the die or within the chip package. The common node may be coupled to ground node, a voltage source, or a node with a pre-determined voltage so as to terminate the unused signals.

Figure 9A:
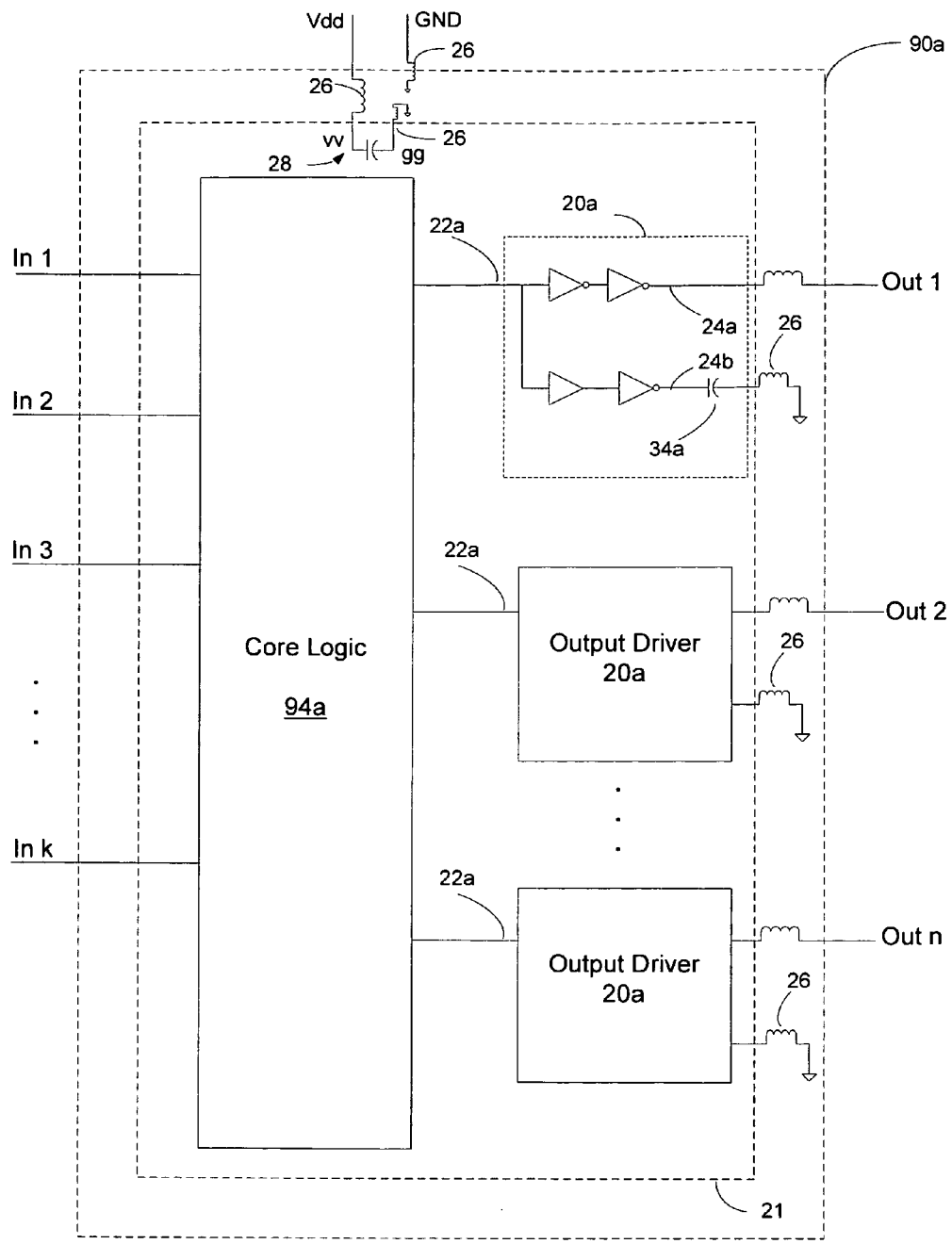
FIGS. 9A-9D depict integrated circuits according to embodiments of the invention.

Attention now turns to FIG. 9A, which depicts schematically an integrated circuit 90a according to an embodiment of the invention. The integrated circuit 90a includes core logic 94a, which may include, for instance, CMOS logic circuits such as a central processing unit (CPU) core, and/or a memory core (e.g., a DRAM core). The integrated circuit 90a further includes output drivers (or "output pads") 20a for providing output signals.

According to the embodiment shown in FIG. 9A, an output driver 20a receives a single-ended signal from the core logic 94a via input 22a. The output driver 20a, which may include circuits shown in FIGS. 4A-4B, converts the single-ended signal into a differential signal, provides one of the component of the differential signal as an output signal via output 24a, and terminates the other component signal via output 24b and capacitor 34a.

According to an embodiment, the output 24a may be coupled to a signal pin designated to provide an output signal, whereas the output 24b may be coupled to a GND pin that is designated to be coupled to system ground. In another embodiment, the output 24b may be coupled to a package ground plane, which is in turn coupled to a GND pin that is designated to be coupled to system ground. In other embodiments, the output 24b may be terminated using other techniques.

Preferably, the output drivers 20a share the same chip voltage "vv" and the same chip ground "gg". However, it should be understood that in other variations the output drivers 20a may or may not share the same chip voltage "vv" or the same chip ground "gg". For instance, one of the output drivers may be coupled to a first chip voltage vv1 and a first chip ground gg1, while another one of the output drivers may be coupled to a second chip voltage vv2 and the chip ground gg1. Furthermore, one of the output drivers may be coupled to a second chip voltage vv2 and a second chip ground gg2. Many other variations may be apparent to those of ordinary skill in the art having the benefit of this disclosure.

Figure 9B:
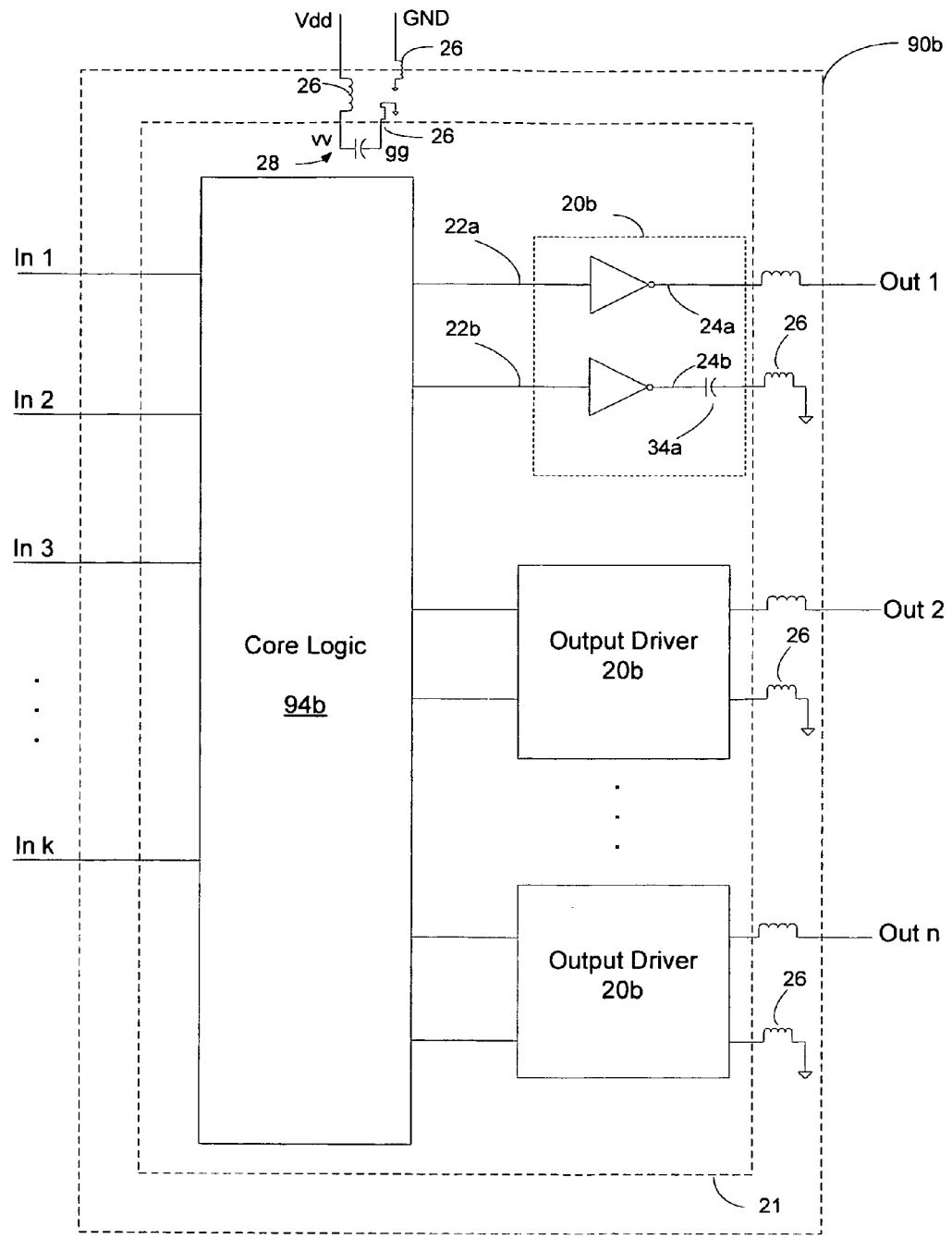

FIG. 9B depicts schematically an integrated circuit 90b according to another embodiment of the invention. The integrated circuit 90b includes core logic 94b and output drivers (or "output pads") 20b for providing output signals. According to the embodiment shown in FIG. 9B the core logic 94b, which may include CMOS logic circuits and/or circuits similar to those shown in FIG. 4A, FIGS. 12A-12G and FIG. 13A, provides differential signals to the output drivers 20b. The output drivers 20b, which may include circuits shown in FIG. 4B, each provide one component of the received differential signal as an output signal via output 24a, and terminates the other component signal via output 24b and capacitor 34a. In the illustrated embodiment, the output driver 20b may include circuits shown in FIG. 4B, for instance an inverter coupled to the input 22a, and another inverter coupled to the input 22b.

Preferably, the output drivers 20b share the same chip voltage "vv" and the same chip ground "gg". However, it should be understood that in other variations the output drivers 20b may or may not share the same chip voltage "vv" or the same chip ground "gg".

Figure 9C:
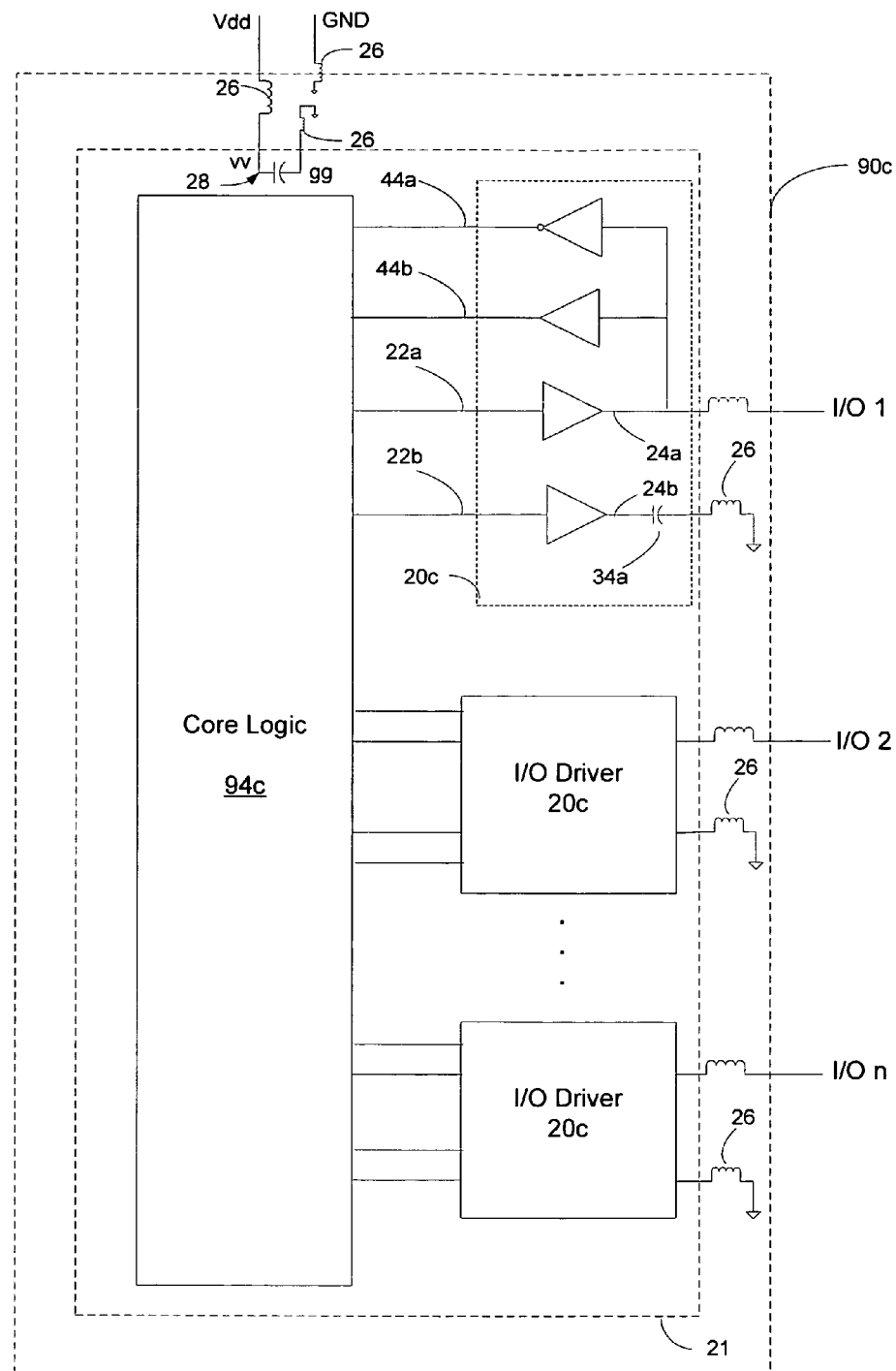

FIG. 9C depicts schematically an integrated circuit 90c according to an embodiment of the invention. The integrated circuit 90c includes core logic 94c and input and output (I/O) drivers (or "I/O pads") 20c for receiving input signals or providing output signals. The core logic 94c may include CMOS logic circuits and/or circuits similar to those shown in FIG. 4A, FIGS. 12A-12G and FIG. 13A. According to the embodiment shown in FIG. 9C, an I/O driver 20c includes an input driver for receiving a signal-ended signal from an external source, and a differential signal driver for receiving a differential signal from the core logic 94 via inputs 22a-22b. The I/O driver 20c may further include a control input (not shown) for receiving a mode selection signal from the core logic 94 that dictates whether the I/O driver 20c should be in an input mode or an output mode.

In the output mode, the I/O driver 20c, which may include circuits shown in FIG. 4B, for instance an inverter coupled to the input 22a and another inverter coupled to the input 22b, provides one of the component signal of the differential signal as an output signal via output 24a, and terminates the other component signal via output 24b and capacitor 34a. The I/O driver 20c may include circuits, for instance like those shown in FIG. 4A, for receiving a single-ended signal via the I/O pin when the driver is in input mode, and for converting the single-ended signal into a differential signal, which may be provided to the core logic 94c via connections 44a-44b.

Preferably, the I/O drivers 20c share the same chip voltage "vv" and the same chip ground "gg". However, it should be understood that in other variations the I/O drivers 20c may or may not share the same chip voltage "vv" or the same chip ground "gg".

Figure 9D:
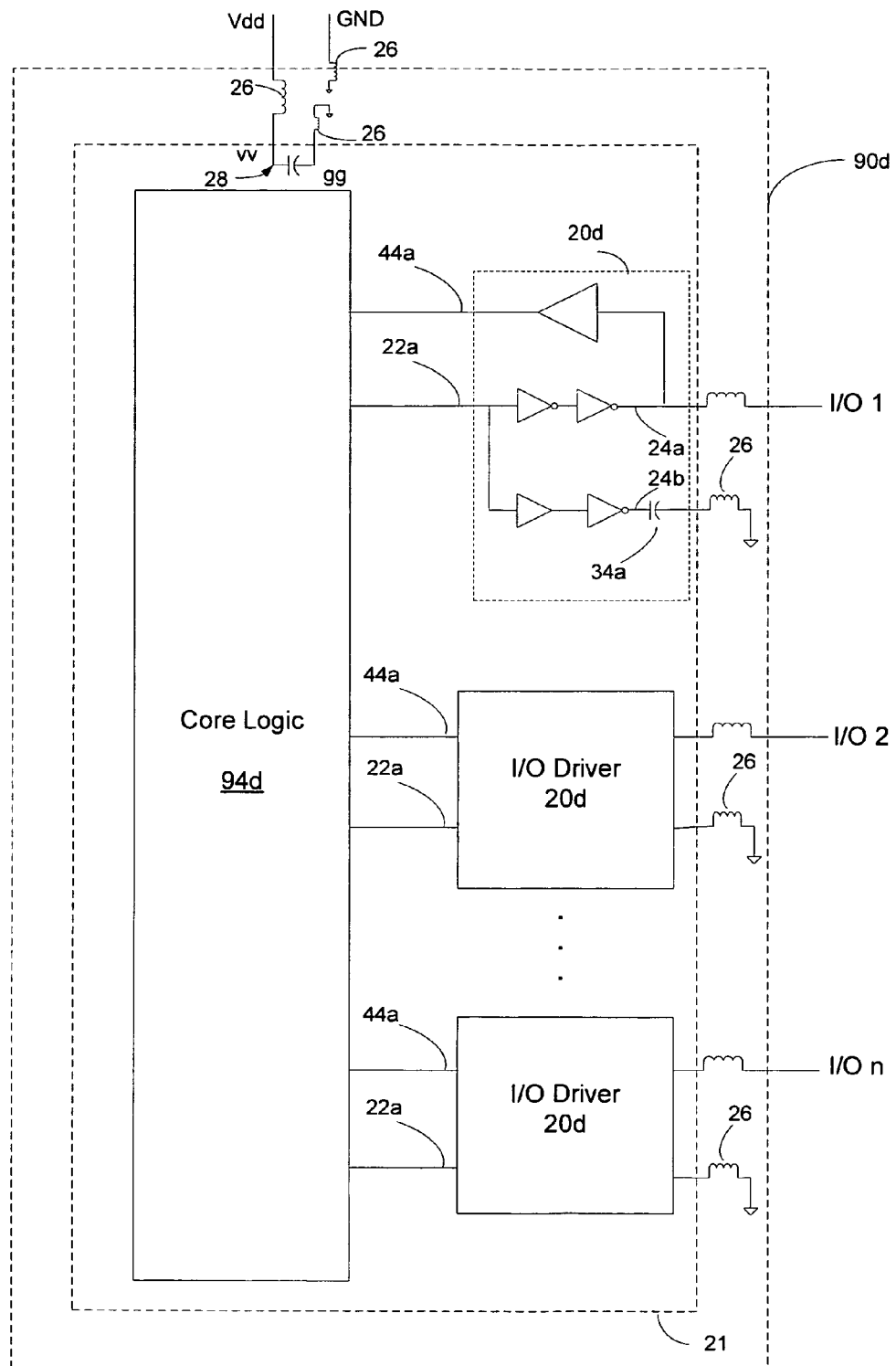

FIG. 9D depicts another embodiment of the invention that is similar to one depicted in FIG. 9C except that the core logic 94d provides and receives single-ended signals to and from I/O drivers (or "I/O pads") 20d. In this embodiment, the I/O drivers 20d may include circuits for converting single-ended signals into differential signals in an output mode, and circuits for providing signals to the core logic 94d in an input mode. Preferably, the I/O drivers 20d share the same chip voltage "vv" and the same chip ground "gg". However, it should be understood that in other variations the I/O drivers 20d may or may not share the same chip voltage "vv" or the same chip ground "gg".

Figure 10:
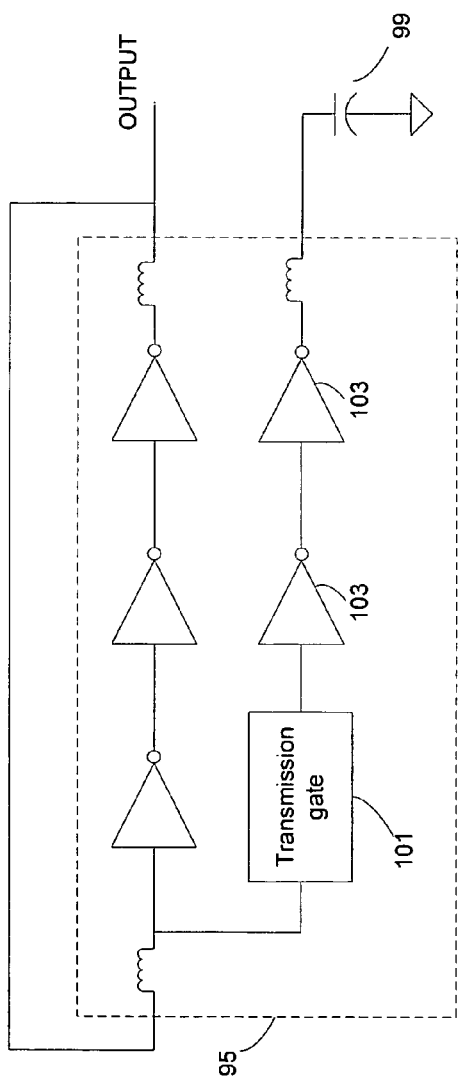
FIG. 10 depicts a ring oscillator circuit implemented according to an embodiment of the invention.

Principles of the present invention may be applied to implement various other types of circuits. For example, a ring oscillator 95 implemented according to an embodiment of the invention is shown in FIG. 10. The ring oscillator 95 includes components found in common ring oscillators. Unlike conventional ring oscillators, however, the ring oscillator 95 includes a transmission gate 101, inverters 103, and capacitor 99 that make up a current path to direct the unused signals to package ground or system ground through a coupling capacitor. The performance of the ring oscillator 95 may be significantly better than conventional designs. In one variation, the ring oscillator disclosed herein may be implemented as a clock for a computer or other electronic devices requiring high frequency clocks.

Figure 11A:
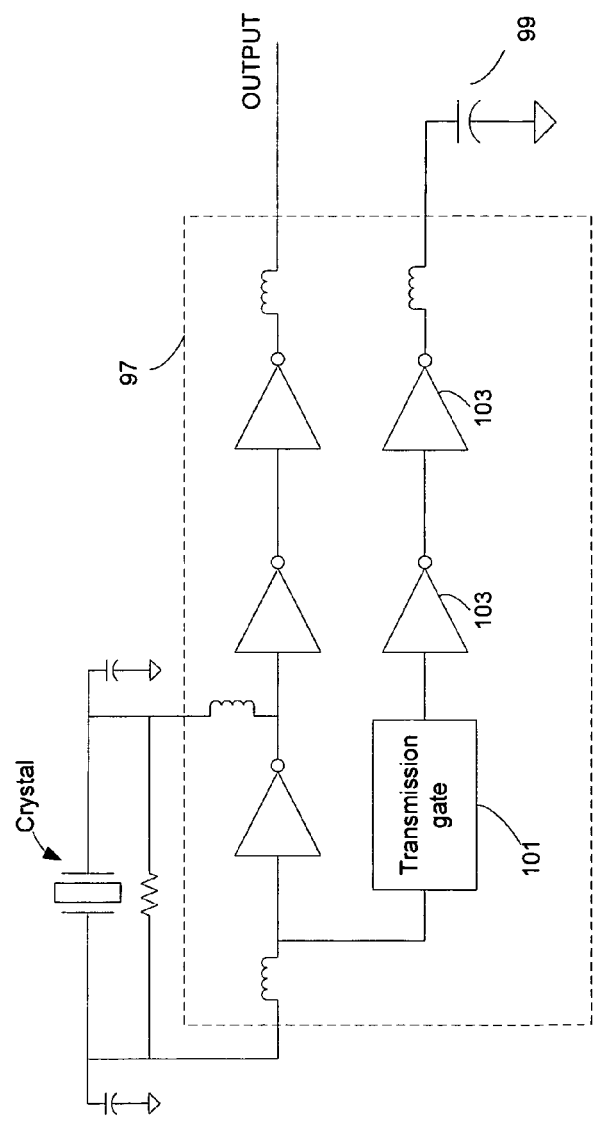
FIG. 11A depicts a crystal oscillator circuit implemented according to an embodiment of the invention.
Figure 11B:
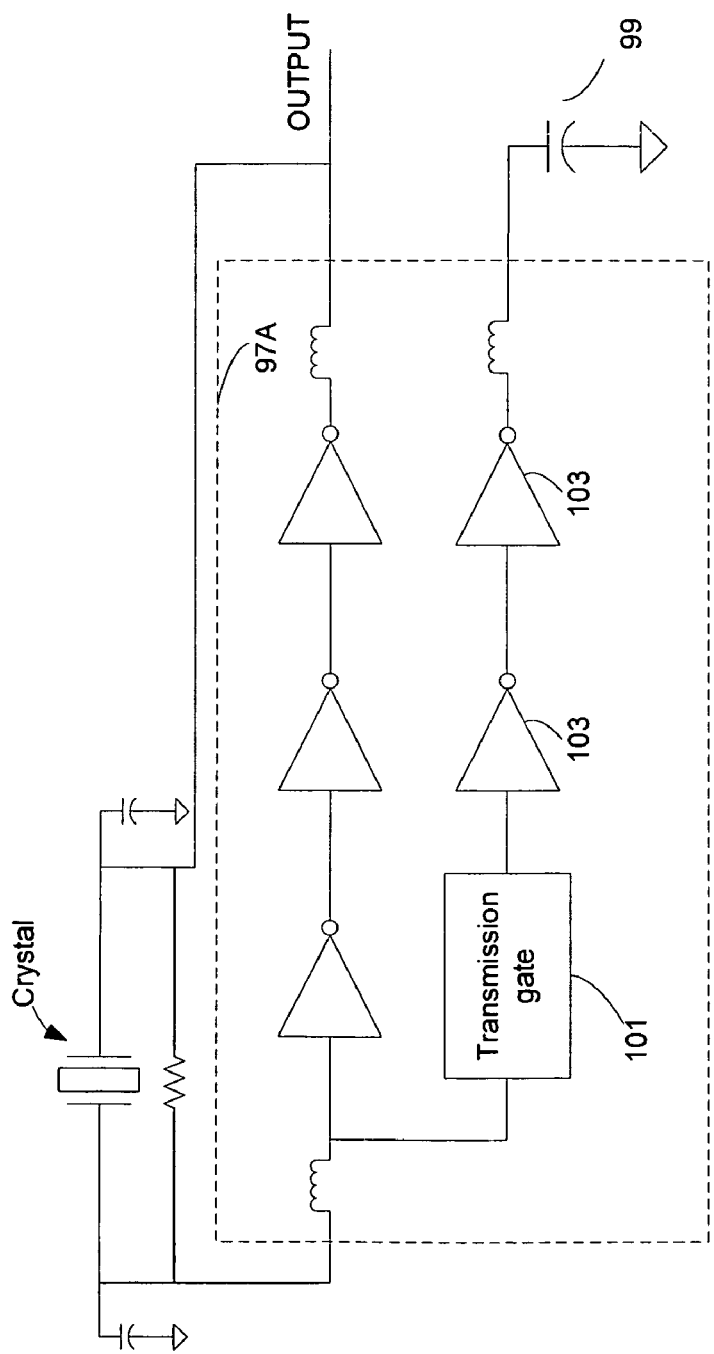
FIG. 11B depicts a crystal oscillator circuit implemented according to another embodiment of the invention.

Referring now to FIG. 11A, a crystal oscillator 97 implemented according to an embodiment of the invention is shown. The crystal oscillator 97 includes components found in common crystal oscillators. Unlike conventional crystal oscillators, however, the crystal oscillator 97 includes a current path (which includes transmission gate 101, inverters 103, and capacitor 99) to direct the unused signals to the system or package ground through a coupling capacitor. The performance of the crystal oscillator 97 may be significantly better than conventional designs. In one variation, the crystal oscillator disclosed herein may be implemented as a clock for a computer or other electronic devices requiring high frequency clocks. An alternate design for a crystal oscillator 97A according to an embodiment of the invention is illustrated in FIG. 11B.

In a computer network system implementation, an embodiment of the differential output driver of invention may be used to enhance performance of a network interface (e.g., an Ethernet adaptor, a DSL module, etc.) by improving the network communication speed and/or by improving the maximum driving distance. Referring now to FIG. 14, there is shown a high-speed serial bus system 140 (such as Ethernet or DSL) according to an embodiment of the invention. The bus system includes a host device 141, a controller 142, a transmitter 144 and a receiver 146. In the illustrated embodiment, the transmitter 144 receives a signal from the controller 142, generates a differential signal, and provides one component signal to the bus. In accordance with an embodiment of the invention, the other component of the differential signal is terminated via a coupling capacitor. An advantage of the serial bus of FIG. 14 is that the output frequency of the transmitter 144 may be very high. If implemented using 0.35 μm TTL-CMOS or a similar technology, the output frequency may be 1 GHz or more. Furthermore, the output power of the transmitter 144 may be 3 V or more. An output power of 3 V or more may allow the signals to be carried by the signal line for a significantly longer distance than that is possible with a lower power output voltage.

Referring now to FIG. 15, there is shown a high-speed wireless communication device 150 implemented according to an embodiment of the invention. The wireless communication device includes a host device 151, a controller 152, a transmitter 154, a receiver 156, and an antenna 159. In the illustrated embodiment, the transmitter 154 receives a differential signal from the controller 152, provides one of the component signals to the antenna 159, and terminates the other. In accordance with an embodiment of the invention, the other component of the differential signal is terminated via a capacitor. An advantage of the wireless device of FIG. 15 is that the output frequency of the transmitter 154 and the power amplifier 158 may be implemented with low cost TTL-CMOS technology, as opposed to more expensive technologies such as GaAs currently used in high-speed wireless communication systems.

Attention now turns to another aspect of the invention. In this aspect of the invention, "voltage mode" differential standard cells are used to implement at least part of the logic core of an integrated circuit such that very high speed can be achieved. For example, the second stage 420 of FIG. 4A and the core logic circuits 90a-90d of FIGS. 9A-9D may include "voltage mode" differential standard cells of the invention. The "voltage mode" differential standard cells may be implemented independently of the high-speed driver circuits described in this specification. Some "voltage mode" differential standard cells according to one aspect of the invention are depicted in FIGS. 12A-12G. The following Table 1 summarizes the description of these figures. For simplicity, "voltage mode differential standard cells" are sometimes referred to herein as "differential standard cells" "differential cells," and/or "differential circuits."

TABLE 1

Figure 12A:
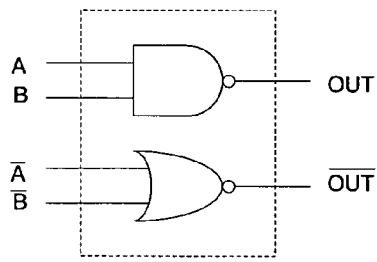
FIGS. 12A-12G depict example differential standard cells according to embodiments of the invention.
Figure 12B:
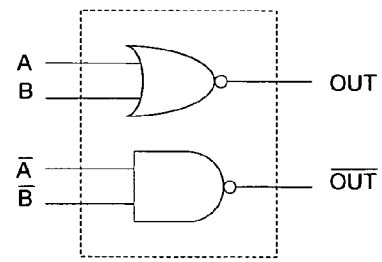
Figure 12C:
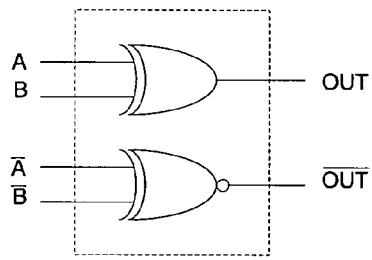
Figure 12D:
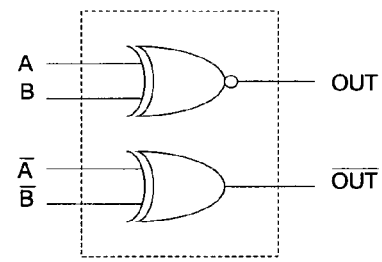
Figure 12E:
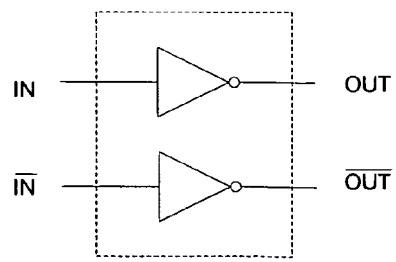
Figure 12F:
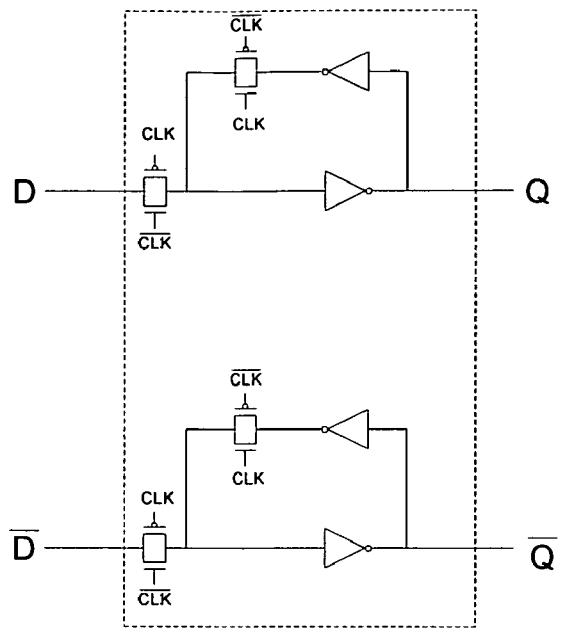
Figure 12G:
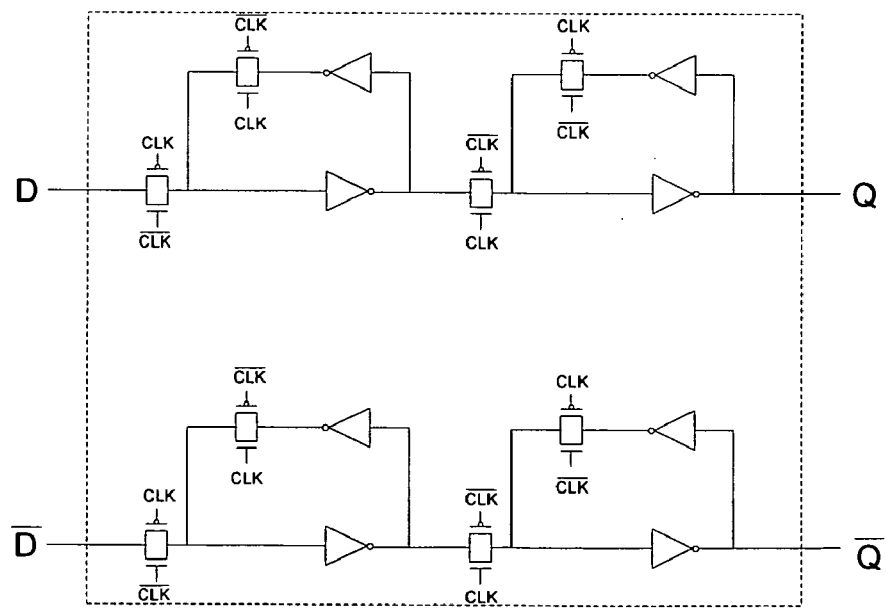

| | |
|---|---|
| FIG. 12A | Differential NAND cell |
| FIG. 12B | Differential NOR cell |
| FIG. 12C | Differential XOR cell |
| FIG. 12D | Differential XNOR cell |
| FIG. 12E | Differential NOT cell |
| FIG. 12F | Differential latch cell |
| FIG. 12G | Differential D flip flop cell |

According to an embodiment of the invention, a differential standard cell includes at least in part a pair of logically complementary circuits one of which is for performing a logic function, and another of which is for performing a logically complementary function. For example, consider the differential NAND cell shown in FIG. 12A. The differential NAND cell includes a NAND gate for performing a NAND operation on inputs A and B to produce an output value OUT. The differential NAND cell further includes a NOR gate for performing a NOR operation on inputs A_bar and B_bar to produce an output value OUT_bar that is inverse to OUT. Preferably, the differential cells share the same chip voltage "vv" and the same chip ground "gg." However, it should be understood that in other variations the differential cells may or may not share the same chip voltage "vv" or the same chip ground "gg."

Figure 20:
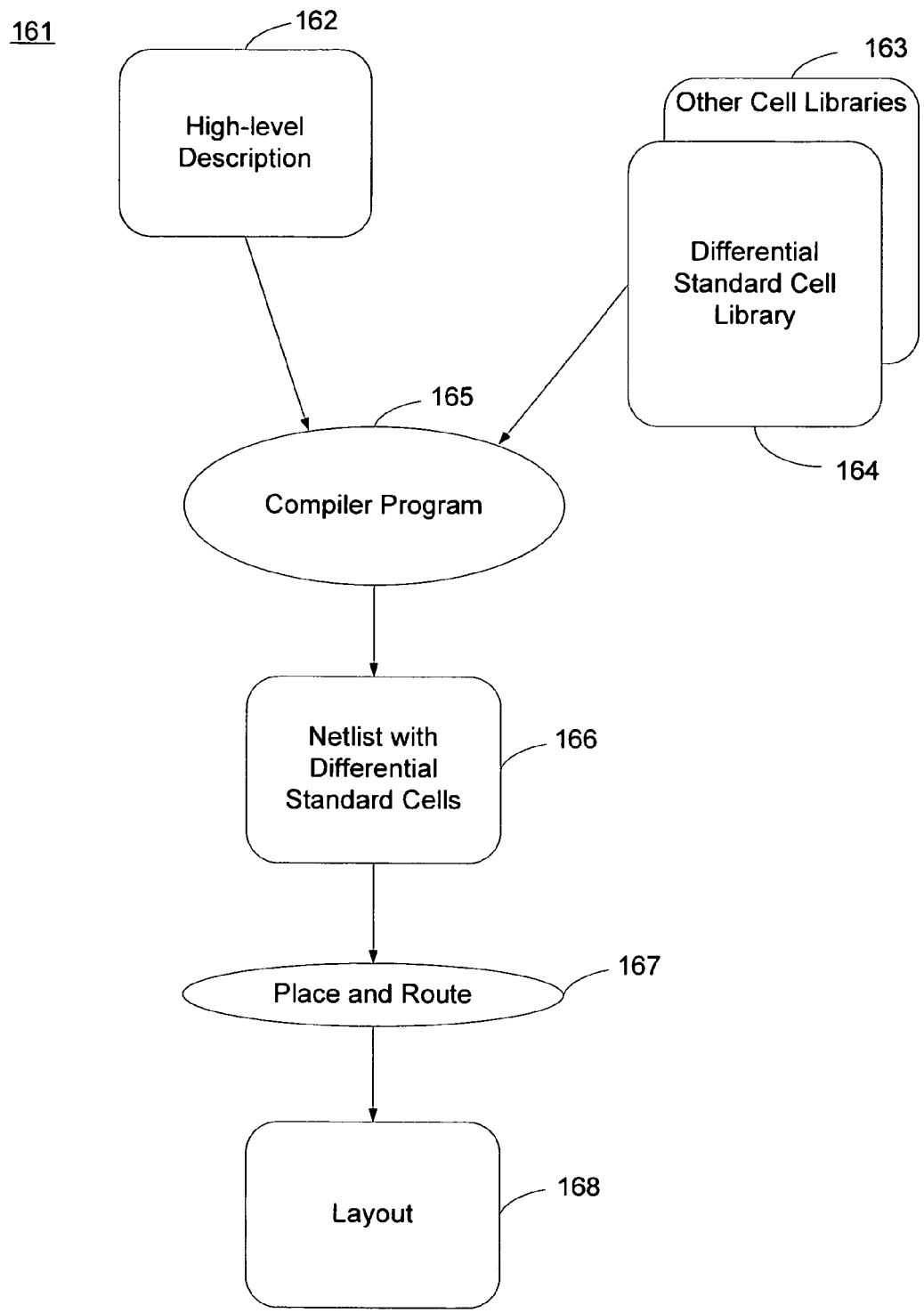
FIG. 20 is a flow diagram depicting an example IC design process according to one aspect of the present invention.

According to an embodiment of the invention, the differential standard cells are considered building blocks or "primitive cells" of an integrated circuit design, and they may be used by an automated electronic design process to produce an integrated circuit. A flow diagram depicting an IC design process 161 according to one aspect of the invention is shown in FIG. 20. The process 161 described with respect to this flow chart is implemented within a computer system in a CAD (computer automated design) environment. Within the process 161, a circuit designer first generates a high-level description 162 of a circuit in a hardware description language such as Verilog.

A computer-implemented compiler program 165 processes this high-level description 162 and generates therefrom a detailed list of logic components and the interconnections between these components. This list is called a "netlist" 166. The components of the netlist 166 can include primitive cells such as full-adders, NAND gates, NOR gates, XOR gates, latches, and D-flip flops, etc. According to an embodiment of the invention, the netlist 166 includes differential standard cells, such as those described above with reference to FIGS. 12A-12G, as primitive cells.

In processing the high-level description, the compiler program 165 may first generate a netlist of generic primitive cells that are technology independent. According to one embodiment of the invention, the compiler 165 may then apply a Differential Standard Cell Library 164 and/or other cell libraries 163 to this generic netlist in order to generate a netlist 166 that contains differential standard cells. For example, if the generic netlist includes a NAND gate, then the compiler 165 may map a differential NAND cell to the NAND gate to produce a netlist that includes a NAND gate and a NOR gate.

The netlist 166, however, does not contain any information with respect to the physical design of the circuit. For example, the netlist 166 does not specify where the cells are placed on a circuit board or silicon chip, or where the interconnects run. Determining this physical design information is the function of a computer controlled place-and-route process 167.

The place-and-route process 167 first finds a location for each cell on a circuit board or silicon chip. The locations are typically selected to optimize certain objectives such as wire length, circuit speed, power consumption, and/or other criteria, and subject to the condition that the cells are spread evenly over the circuit board or silicon chip and that the cells do not overlap with each other. The place-and-route process 167 also generates the wire geometry based on the placement information for connecting the pins of the cells together. The output of the place-and-route process 167 includes cell placement data structures and wire geometry data structures that are used to make the final geometric database needed for fabrication of the circuit. The placement and wire geometry data structures of the design are sometimes referred to as a "layout" 168. The layout 168 can be regarded as a template for the fabrication of the physical embodiment of the integrated circuit using transistors, routing resources, etc.

Figure 16A:
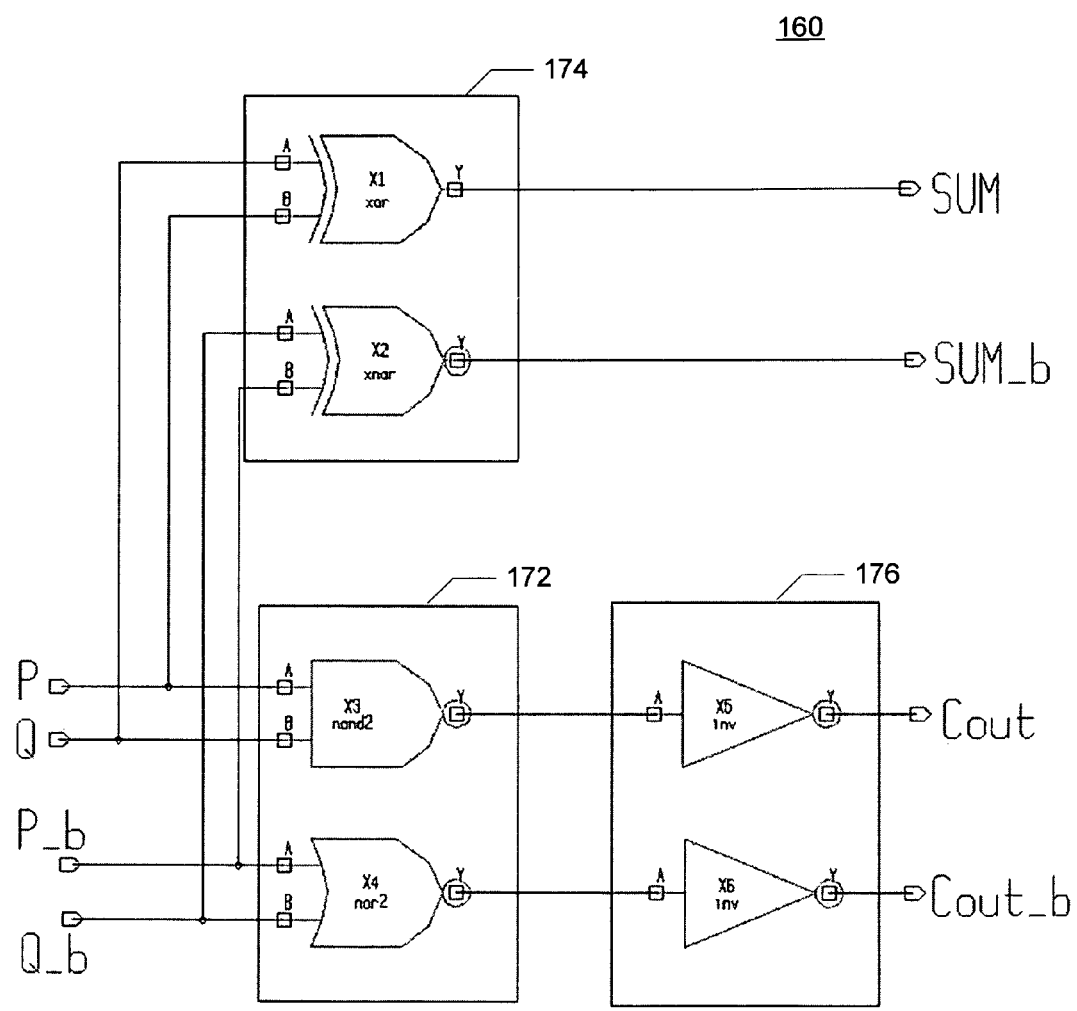
FIG. 16A depicts an example half-adder circuit implemented according to an embodiment of the invention.

Due to the requirement of additional gates, it is expected circuits containing differential standard cells of the invention may require more die area than circuits implementing a similar logic function without using differential standard cells. An example differential half-adder circuit 160 according to an embodiment of the invention is illustrated in FIG. 16A. Note that the half-adder circuit 160 includes two inputs for receiving P and Q, and two inputs for receiving the complements of P and Q (denoted by P_b and Q_b). The half-adder circuit 160 further includes an output for providing Cout and another output for providing the complement or inverse of Cout (denoted by Cout_b). The circuit 160 may be implemented with a differential NAND cell 172, a differential XOR cell 174, and a differential NOT cell 176. Note that a portion of the circuit 160, which is used for producing the inverse of C_out, is logically complementary to the portion that is responsible for generating C_out. Also note that in FIG. 16A, a NAND gate, a XOR gate, and a NOT gate in one portion of the circuit are mirrored by a NOR gate, an XNOR gate, and a NOT gate, respectively, in the complementary portion of the circuit.

Figure 16B:
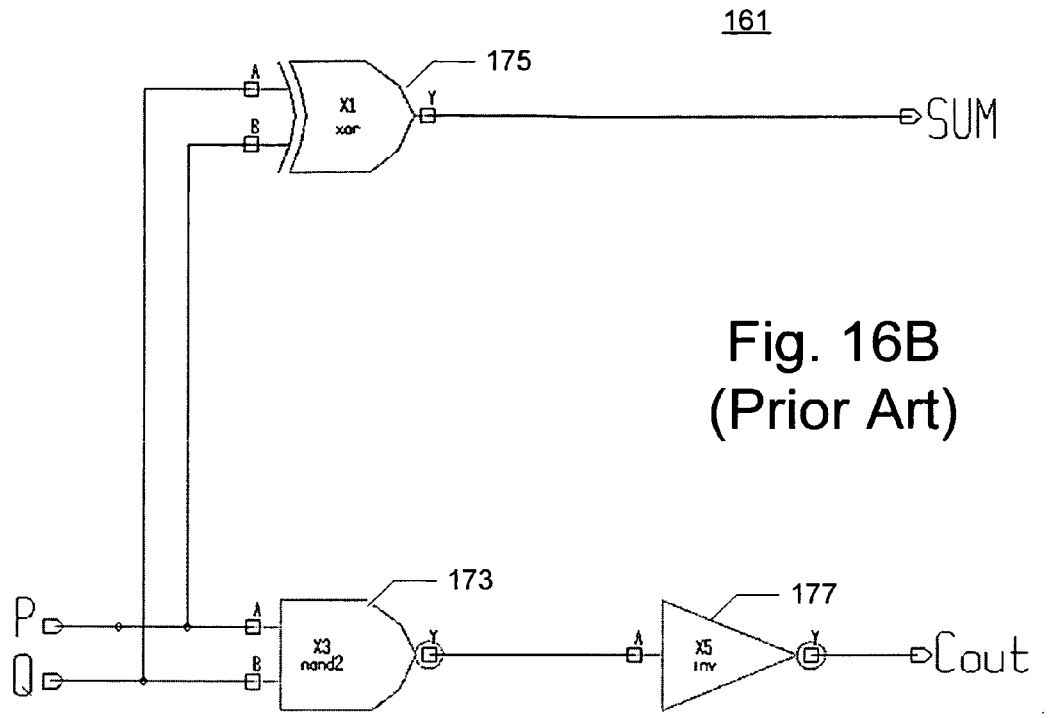
FIG. 16B depicts a half-adder circuit that is known in the art.

A conventional half-adder circuit 161 is illustrated in FIG. 16B. Note that the conventional half-adder design includes a NAND gate 173, a XOR gate 175, and a NOT gate 177. According to an embodiment of the invention, the half-adder circuit 160 may be created by replacing a NAND gate 173, a XOR gate 175, and a NOT gate 177 by a differential NAND cell 172, a differential XOR cell 174, and a differential NOT cell 176, respectively, and by appropriately connecting the inputs of the circuit 160 to inputs P, Q, Pb_b and Q_b.

Figure 17B:
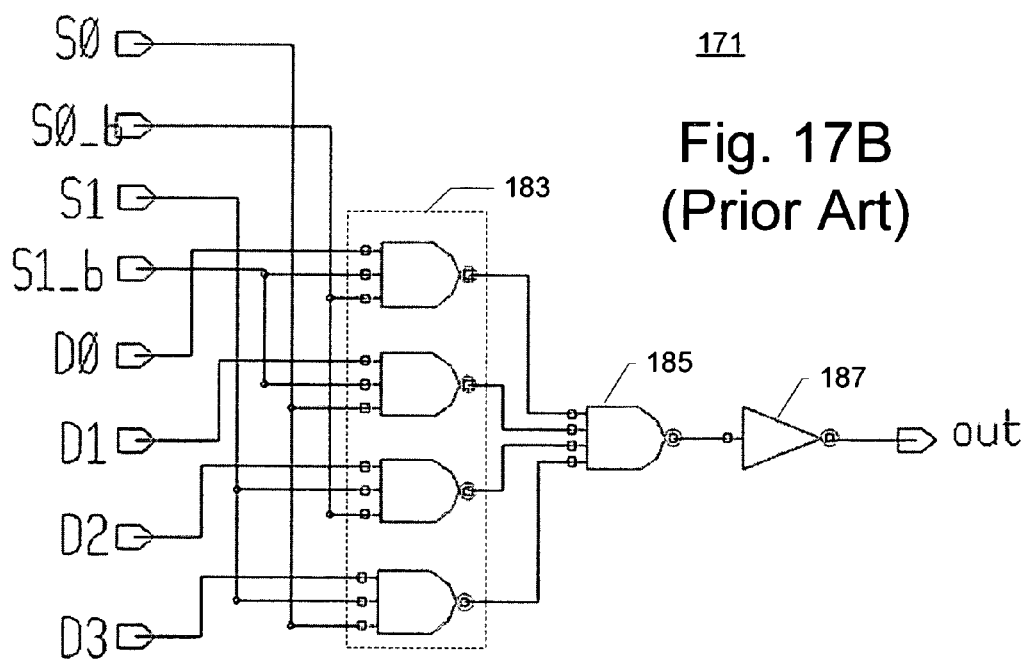
FIG. 17B depicts a 4-to-1 multiplexer circuit that is known in the art.
Figure 17A:
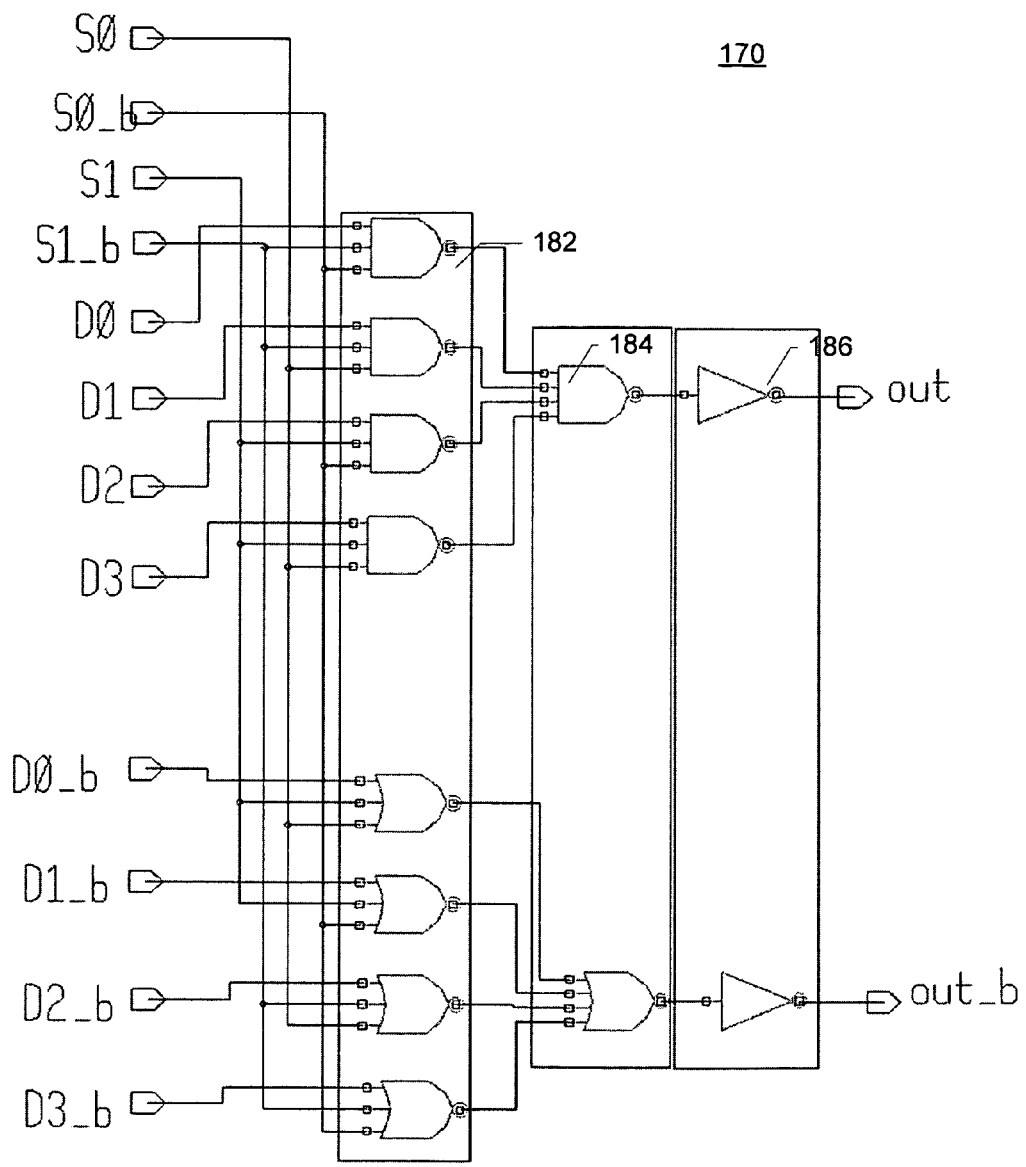
FIG. 17A depicts an example 4-to-1 multiplexer circuit implemented according to an embodiment of the invention.

An example differential 4-to-1 multiplexer circuit 170 according to an embodiment of the invention is illustrated in FIG. 17A. The multiplexer circuit 170 includes one set of inputs for receiving data and another set of inputs for receiving the complements of the data. Furthermore, the multiplexer circuit 170 includes two outputs for providing an output value and its complement. The circuit 170 may be implemented with 5 differential NAND cells 182, 184 and a differential NOT cell 186. Note that a portion of the circuit 170, which is used for producing "out_b," is logically complementary to the portion that is responsible for generating "out."

A conventional 4-to-1 multiplexer circuit 171 is illustrated in FIG. 17B. Note that the conventional 4-to-1 multiplexer circuit includes NAND gates 183, 185 and a NOT gate 187. According to an embodiment of the invention, the multiplexer circuit 170 may be created by replacing the NAND gates 183, 185 and a NOT gate 187 by differential NAND cells 182, 184, and a differential NOT cell 186, respectively, and by appropriately connecting the inputs of the circuit 170.

Figures 26A, 26B:
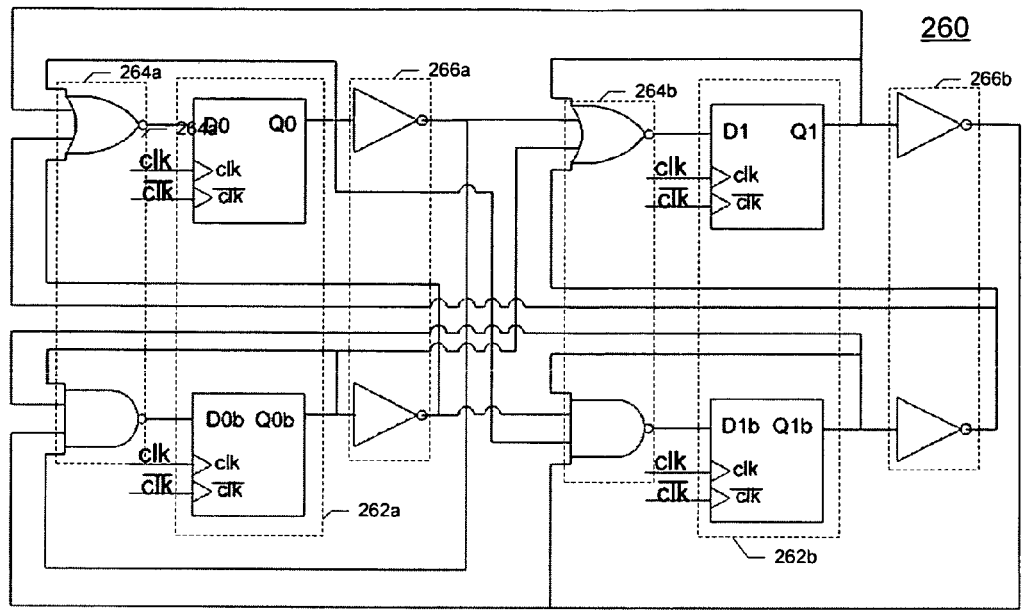
FIG. 26A depicts an example divide-by-three counter circuit implemented according to an embodiment of the invention.
FIG. 26B depicts a truth table for the divide-by-three counter circuit of FIG. 26A.
Figures 26C, 27:
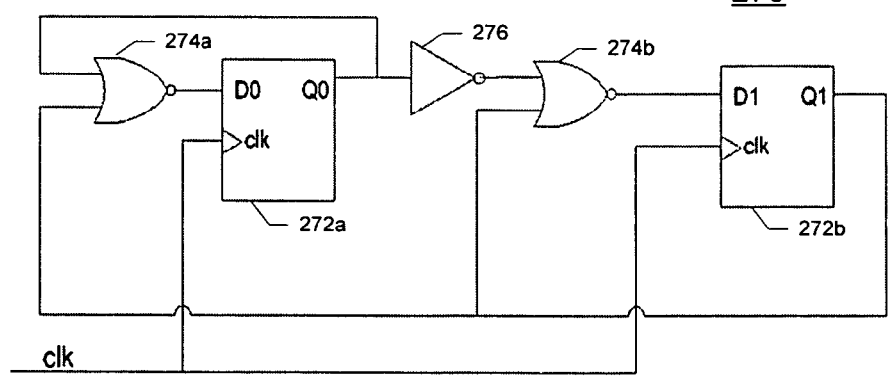
FIG. 26C depicts input equations for the divide-by-three counter circuit of FIG. 26A.
FIG. 27 depicts a divide-by-three counter circuit that is known in the art.

An example differential state machine according to an embodiment of the invention is illustrated in FIG. 26A. In particular, a divide-by-three counter circuit 260 is shown. The counter circuit 260 is implemented by two differential D-Flip Flop cells 262a-262b, two differential NOR cells 264a-264b, and two differential NOT cells 266a-266b. A non-differential divide-by-three counter circuit 270 is depicted in FIG. 27 for illustration purposes. The design of the non-differential divide-by-three counter circuit 270 is relatively straightforward. The differential differential divide-by-three counter circuit 260, on the other hand, is significantly more complex than the non-differential one. A method of implementing differential state machines, such as the divide-by-three counter circuit 260, is described further below.

Figure 21:
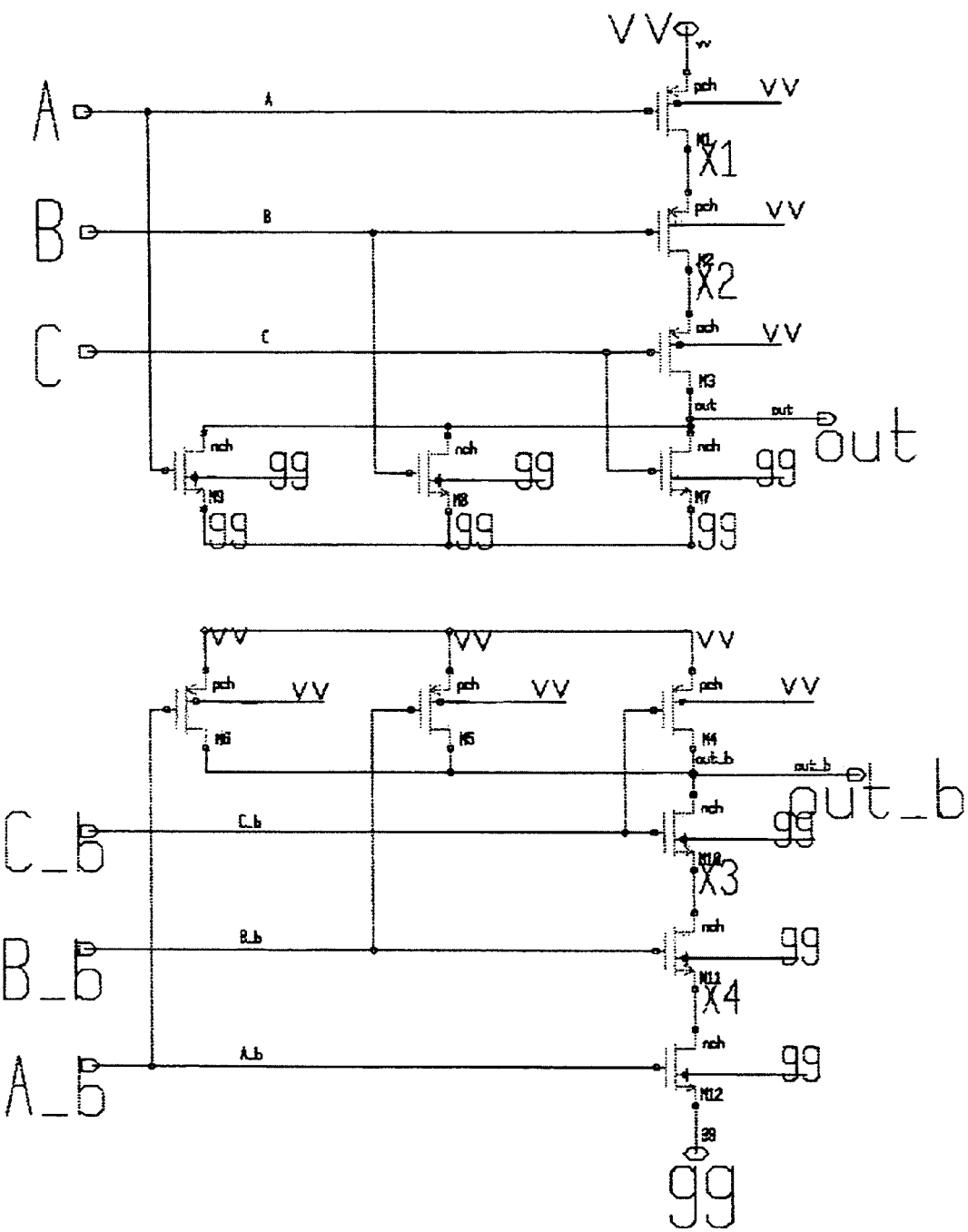
FIG. 21 depicts a transistor-level schematic diagram of an exemplary 3-input voltage-mode differential NAND cell according to an embodiment of the invention.
Figure 22:
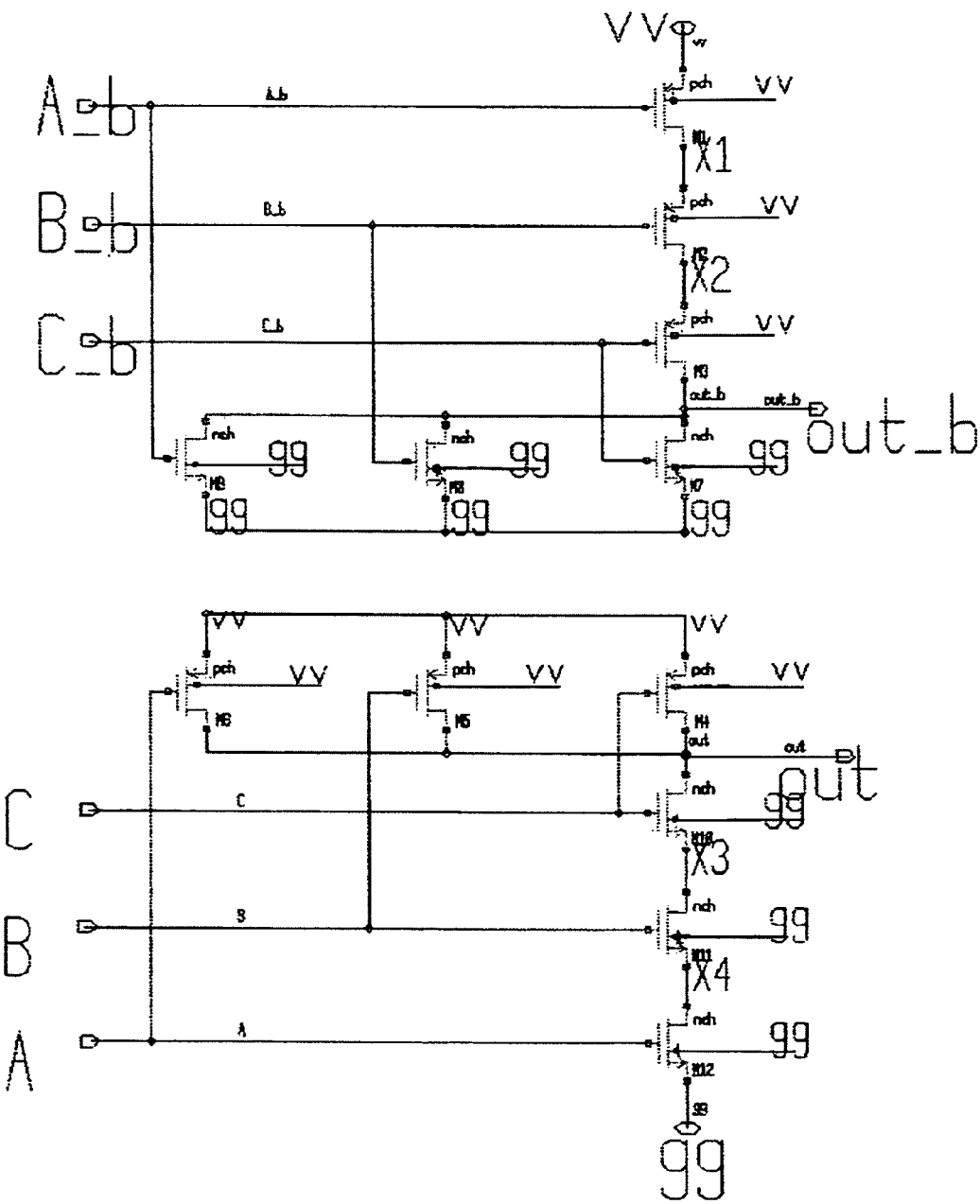
FIG. 22 depicts a transistor-level schematic diagram of an exemplary 3-input voltage-mode differential NOR cell according to an embodiment of the invention.
Figure 23:
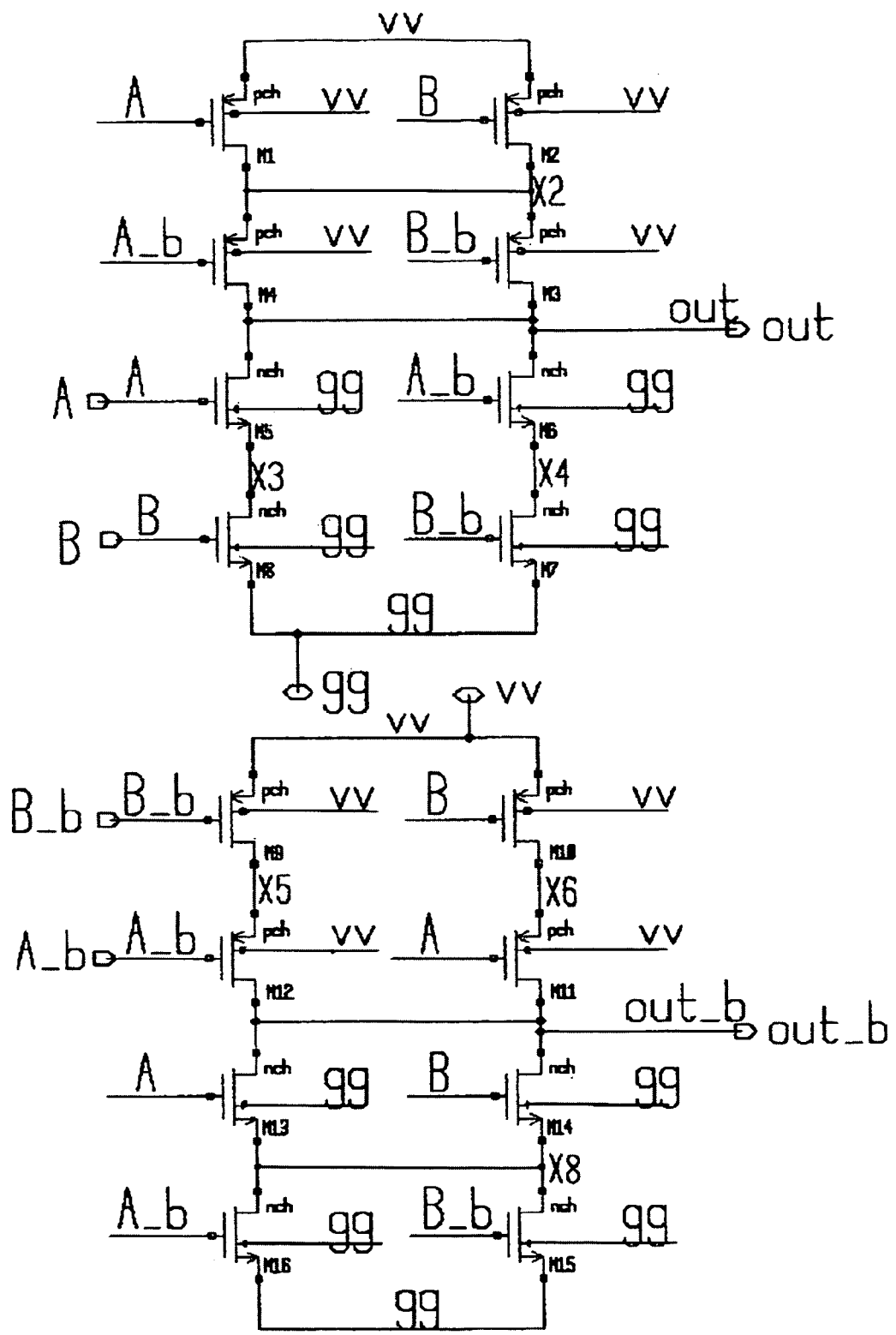
FIG. 23 depicts a transistor-level schematic diagram of an exemplary 2-input voltage-mode differential XOR cell according to an embodiment of the invention.
Figure 24:
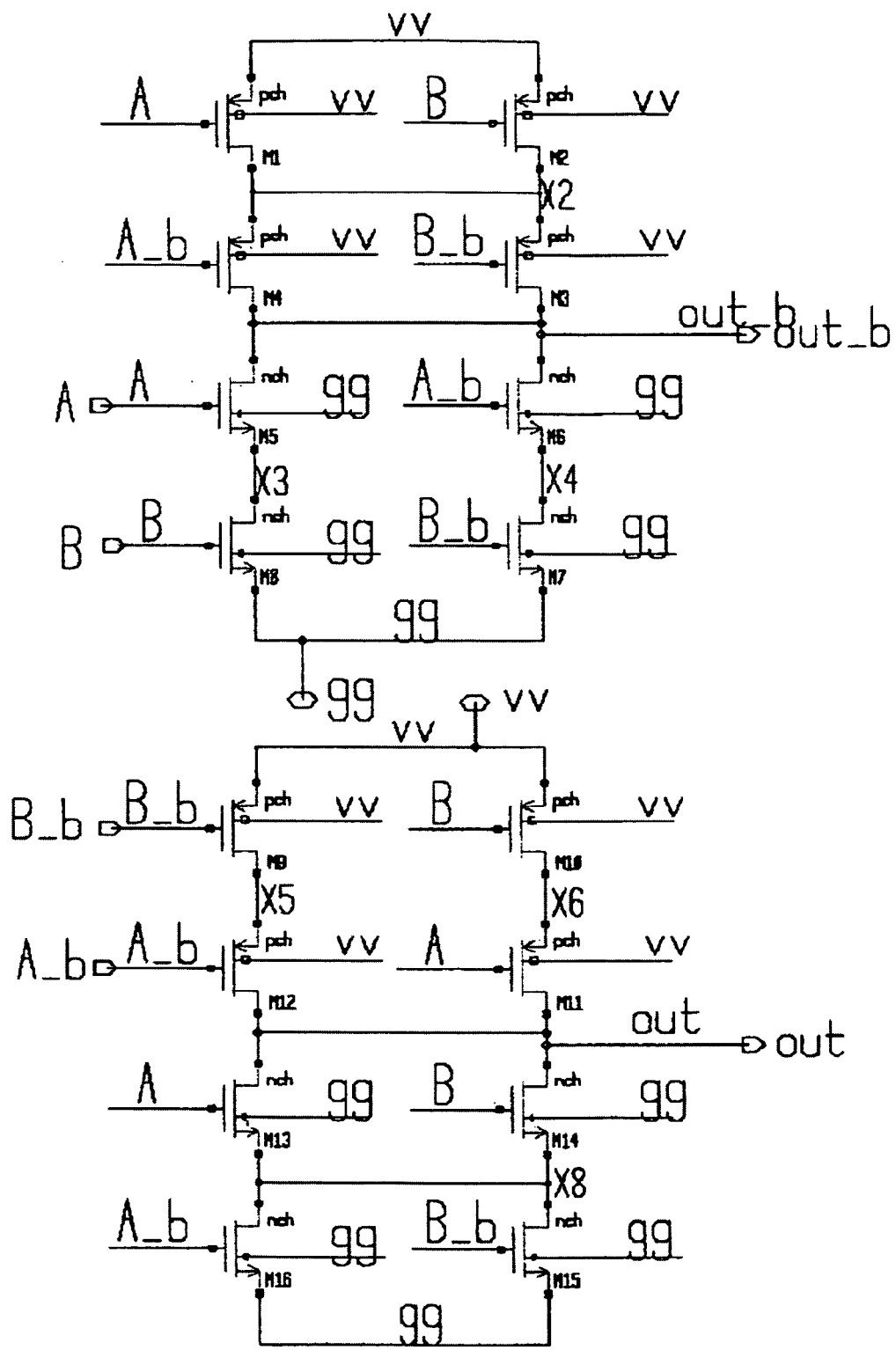
FIG. 24 depicts a transistor-level schematic diagram of an exemplary 2-input voltage-mode differential XNOR cell according to an embodiment of the invention.

A diagram illustrating an example transistor-level implementation of a differential NAND cell of FIG. 12A is shown in FIG. 19. A diagram illustrating an example transistor-level implementation of a differential NOR cell of FIG. 12B is shown in FIG. 18. A transistor-level schematic diagram of an exemplary 3-input differential NAND cell is shown in FIG. 21. A transistor-level schematic diagram of an exemplary 3-input differential NOR cell is shown in FIG. 22. A transistor-level schematic diagram of an exemplary 2-input differential XOR cell is shown in FIG. 23. A transistor-level schematic diagram of an exemplary 2-input differential XNOR cell is shown in FIG. 24. A transistor-level schematic diagram of an exemplary 2-input "voltage mode" differential comparator is shown in FIG. 13A. These implementation diagrams are shown for illustration purposes only. One of ordinary skill in the art having the benefit of the disclosure herein would appreciate that other differential cell types, such as digital logic circuits, analog circuits, and mixed-signal circuits may be implemented as well. Any such "voltage mode" differential cells, although not explicitly depicted and described herein, are considered to be within the scope of the present invention. In light of the present disclosure, a person skilled in the art would realize that the differential standard cells may be implemented in many different ways. One of ordinary skill in the art having the benefit of the disclosure herein would appreciate that most logic circuits in the market may be reconfigured with the differential cells described herein such that complementary circuitry is provided to improve overall circuit performance. It should be understood that the differential circuits described herein may be used to implement various portions of an integrated circuit and that applications of the differential circuits should not be limited to the second stage 420, or core logic 90a-90d.

Figure 25:
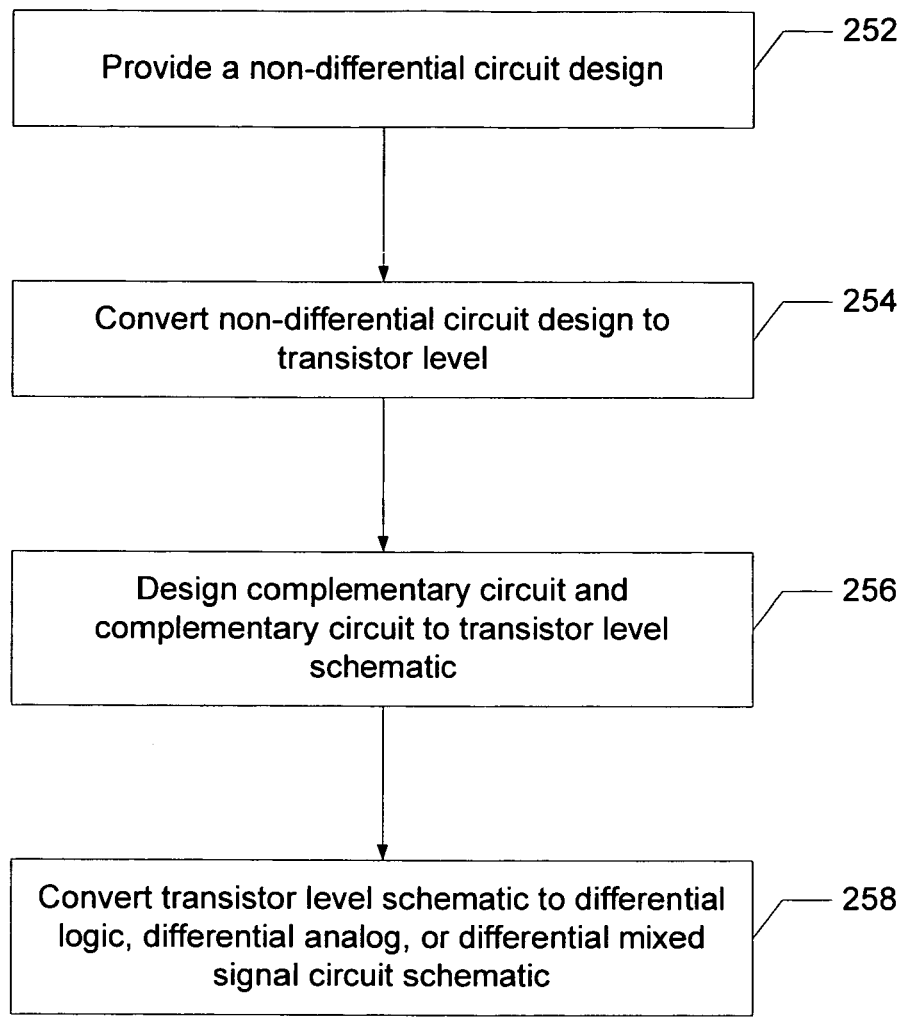
FIG. 25 depicts a flow diagram for a high speed circuit design methodology according to one embodiment of this aspect of the invention.

Attention now turns to yet another aspect of the invention. In this aspect of the invention, a high speed circuit design methodology is provided. FIG. 25 depicts a flow diagram 250 according to one embodiment of this aspect of the invention. As shown, at step 252, a functional-level or logic-level schematic for a circuit is provided. The circuit may be a digital logic circuit, analog circuit, or mixed-signal circuit. Then, at step 254, the schematic for the circuit is converted to transistor level. Then, at step 256, a complementary circuit is designed and added to the transistor level schematic. This complementary circuit, in one embodiment, performs a logic function that is complementary to the logic function of the first circuit and has a same number of nodes as the first circuit. Furthermore, the nodes in the complementary circuit are complementary to the corresponding nodes in the first circuit. In addition, the rise/fall time of each node in the first circuit matches the fall/rise time of a corresponding node in the complementary circuit. The trace length between certain nodes of the complementary circuit may have to match the trace length between corresponding nodes of the first circuit. The pull-up and pull-down currents at the appropriate nodes of the first circuit may have to match the currents at the corresponding nodes at the complementary circuit to suppress noise. The resulting circuit design is referred to herein as a "voltage-mode differential circuit," which is capable of operating at a clock speed significantly higher than the clock speed at which the first circuit is capable of operating. At step 258, the resulting transistor level schematic, which may include twice the transistors than the original transistor level schematic, is then converted to a differential logic, differential analog, or differential mixed-signal circuit schematic.

It should be noted that, a person of ordinary skill in the art having the benefit of this disclosure would realize the "voltage mode" differential circuit design methodology according to this aspect of the invention is applicable to the design of many digital logic circuits (e.g., CMOS circuits), analog circuits, and/or mixed signal circuits.

As an illustration of the design methodology of FIG. 25, consider the design of a differential NAND cell of FIG. 12A. First, a NAND gate 192 is provided at the transistor-level (FIG. 19). A second circuit, a NOR gate 194, is then created. Note that the NOR gate 194 is implemented with a same number of transistors as the NAND gate 192. Furthermore, note that the NOR gate 194 is implemented with a same number of nodes as the NAND gate 192. Further note that NAND gate 192 has three nodes N1, N2 and N3, while NOR gate 194 has three nodes N1', N2' and N3'. According to an embodiment of the invention, each time a node of the NAND gate 192 switches state (e.g., from logic 0 to logic 1), a corresponding node at the NOR gate 194 should switch state as well. For example, when the input A is 0 and if the input B is switching from 0 to 1, the transistor M5 will turn on to drive the output signal OUT from 1 to 0. Correspondingly, the transistor M3 will drive output signal OUT_b from 0 to 1. The rise/fall time at each node of the NAND gate 192 should match the fall/rise time at each corresponding node of the NOR gate 194. The pull-up and pull-down current at each node of the NAND gate 192 should match the pull-down and pull-up current at each corresponding node of the NOR gate 194. Finally, the trace length between nodes of the NAND gate 192 should match the trace length between corresponding nodes of the NOR gate 194. It is believed that the differential circuits designed according to the design methodology disclosed herein will have superior performance over non-differential circuits, such as the NAND gate 192 if implemented without NOR gate 194.

Figure 13B:
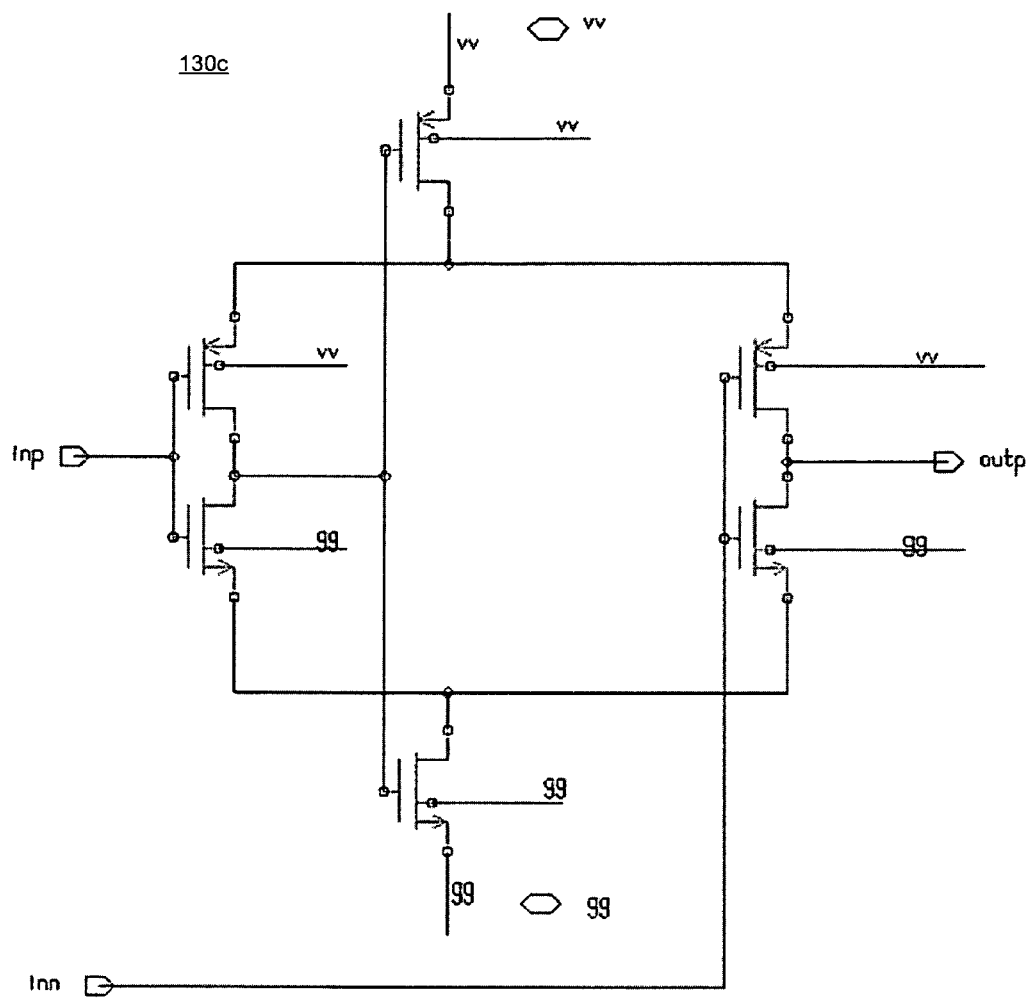
FIG. 13B depicts a comparator circuit that is known in the art.

As another illustration of the design methodology of FIG. 25, consider the design of a differential comparator cell 130 of FIG. 13A, which includes comparator circuits 130a-130b. First, a comparator circuit 130a is provided at the transistor-level (FIG. 13B). A second comparator circuit 130b, is then created. Note that the first comparator circuit 130a is implemented with a same number of transistors as the second comparator circuit 130b. Furthermore, note that the second comparator circuit 130b is implemented with a same number of nodes as the first comparator circuit 130a. Further note that first comparator circuit 130a has three nodes N4, N5 and N6, while second comparator circuit 130b has three nodes N4', N5' and N6'. According to an embodiment of the invention, as the voltage level at a node of the first comparator circuit 130a, the voltage level at a corresponding node at the second comparator circuit 130b varies accordingly in an opposite direction. The rise/fall time at each node of the first comparator circuit 130a should match the fall/rise time at each corresponding node of the second comparator circuit 130b. The pull-up and pull-down current at each node of the first comparator circuit 130a should match the pull-down and pull-up current at each corresponding node of the second comparator circuit 130b. Finally, the trace length between nodes of the first comparator circuit 130a should match the trace length between corresponding nodes of the second comparator circuit 130b. It is believed that the differential circuits designed according to the design methodology disclosed herein will have superior performance over non-differential circuits, such as the first comparator circuit 130a if implemented without second comparator circuit 130b.

Figure 28:
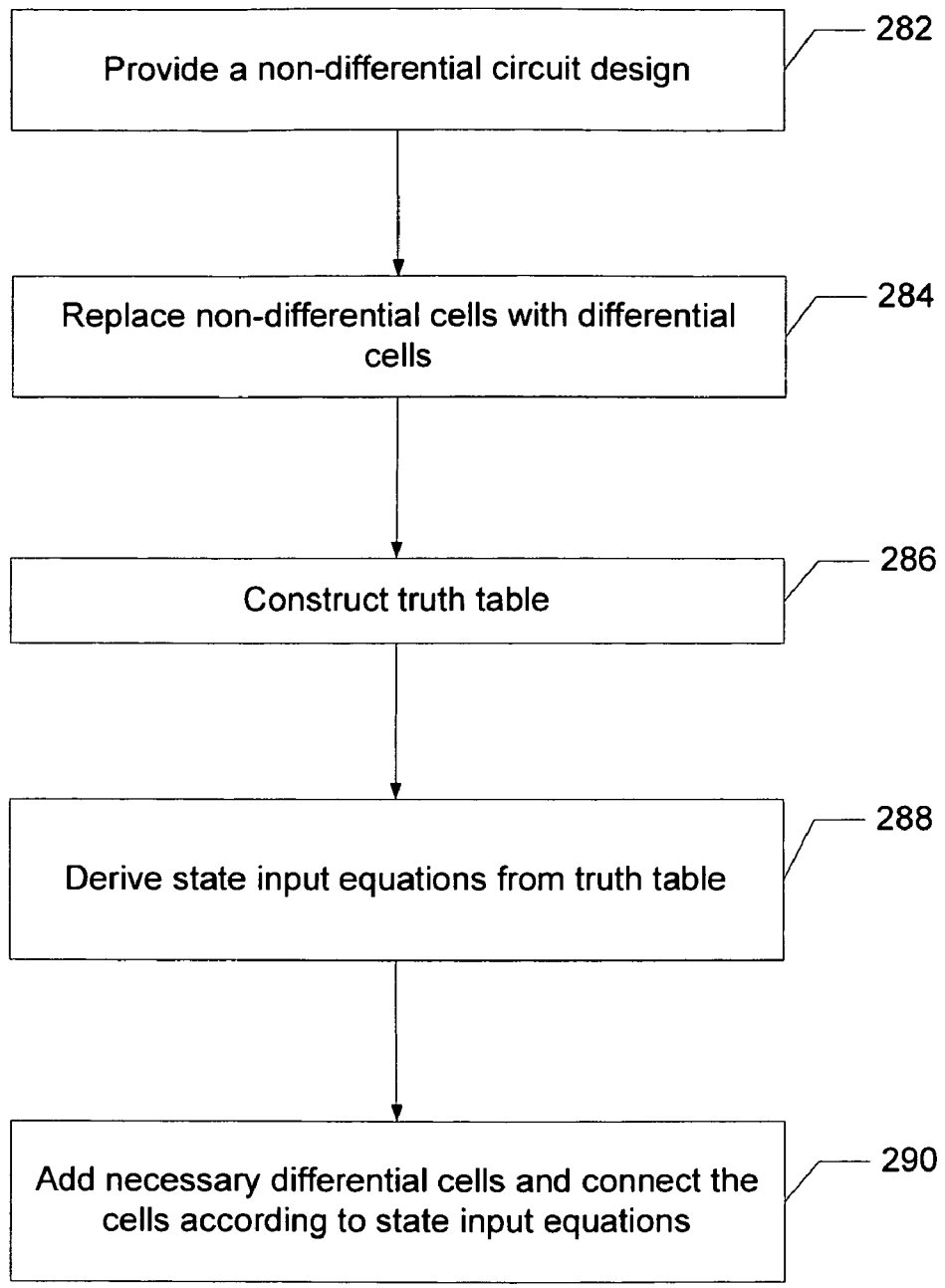
FIG. 28 depicts a flow diagram for a high speed circuit design methodology according to another aspect of the invention.

Attention now turns to FIG. 28, which depicts a differential state machine design flow diagram 280 according to one embodiment of this aspect of the invention. As shown, at step 282, a functional-level or logic-level schematic for a state machine is provided. As an example, consider the divide-by-three counter circuit 270 (FIG. 27), which is implemented by two non-differential D-Flip Flop cells 272a-272b, two non-differential NOR cells 274a-274b, and a non-differential NOT cell 276.

At step 284, the non-differential cells of the non-differential design are replaced by differential cells. In the present example, non-differential cells of the circuit 270 are replaced by two differential D-Flip Flop cells 262a-262b, two differential NOR cells 264a-264b, and a differential NOT cell 266a. Note that the resulting circuit will have four D-Flip Flop cells and therefore the state machine has four state variables and a total of sixteen states. Furthermore, each differential D-Flip Flop cell includes two D-Flip Flops that are complementary to each other. That is, the only the following four states are valid states of the state machines: (Q1, Q1b, Q0, Q0b)=(0, 1, 0, 1); (Q1, Q1b, Q0, Q0b)=(0, 1, 1, 0); (Q1, Q1b, Q0, Q0b)=(1, 0, 0, 1); and (Q1, Q1b, Q0, Q0b)=(1, 0, 1, 0). Other states are invalid states.

At step 286, a truth table for the state machine is constructed. In the present example, the truth table of FIG. 27B is created. At step 288, state input equations of the state machine are derived. Example state input equations are shown in FIG. 27C. Then, at step 290, additional differential cells are added as necessary and the interconnections among the differential cells are derived from the state equations to produce the differential design. In the present example, a differential NOT cells 266b is added, and the divide-by-three circuit 270 is produced by interconnecting differential cells according to the state input equations.

It should be understood by those having ordinary skill in the art and having the benefit of the present disclosure that the design methodology outlined in FIG. 28 may be carried out by electronics design automation software and that certain steps may be included or excluded by such software.

Figure 29:
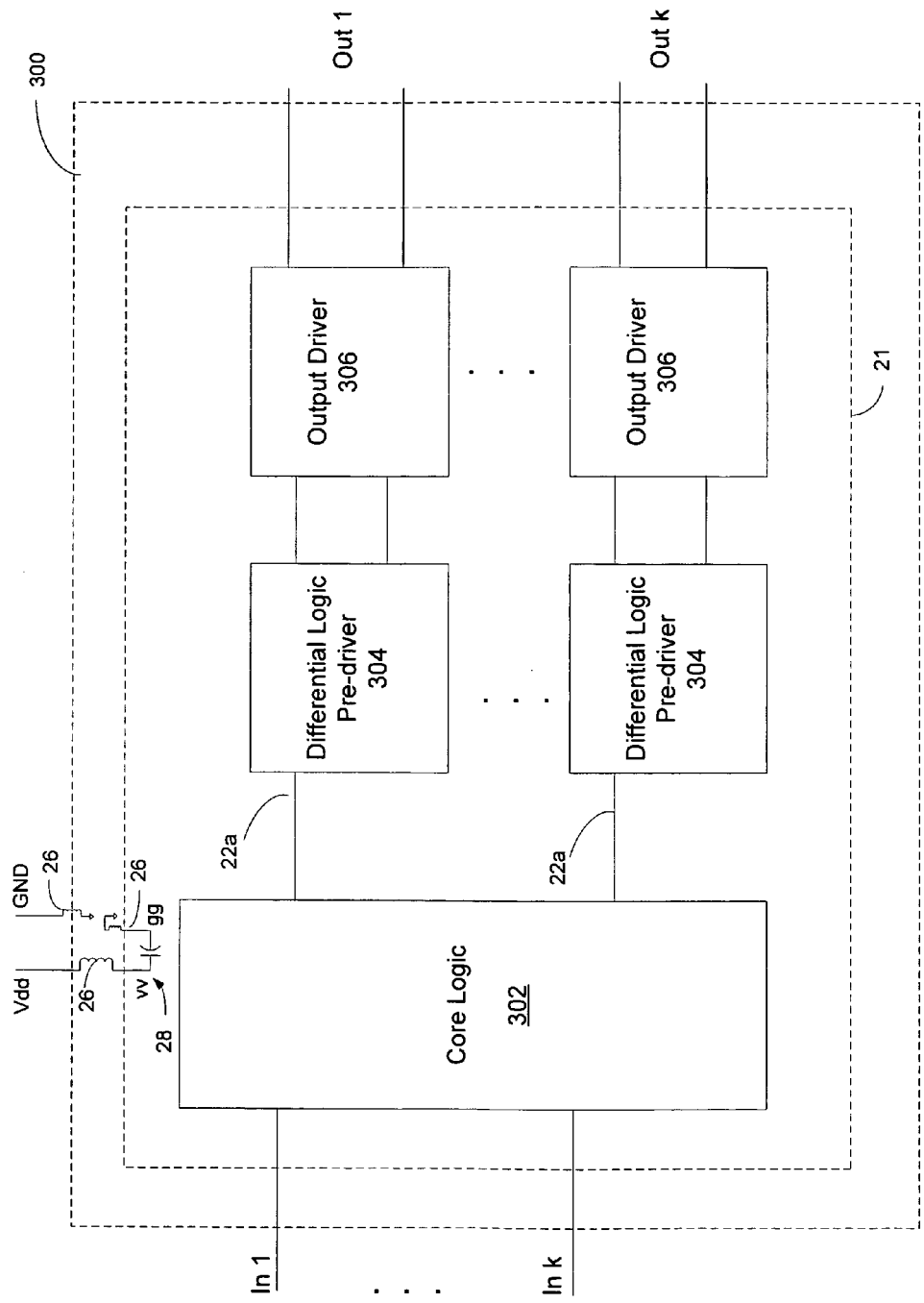
FIG. 29 depicts an integrated circuit according to another embodiment of the invention.

Attention now turns to FIG. 29, which depicts schematically an integrated circuit 300 according to an embodiment of the invention. The integrated circuit 300 includes core logic 302, which may include, for instance, CMOS logic circuits such as a central processing unit (CPU) core, and/or a memory core (e.g., a DRAM core). The integrated circuit 300 further includes differential pre-drivers 304 and output drivers (or "output pads") 306 for providing output signals.

According to the embodiment shown in FIG. 29, differential pre-drivers 304 receive single-ended signals from the core logic 302 via inputs 22a. The differential pre-drivers 304, which may include circuits constructed according to embodiments of the invention described herein, convert the single-ended signals into differential signals, and provide the differential signals to output drivers 306. The output drivers 306 may be conventional differential drivers designed using conventional differential technologies such as HSTL, TTL, LVDS, LVPECL, etc. In another embodiment, an output driver 306 may include two inverter circuits such as inverters 432a-b of FIG. 4B.

Figure 30:
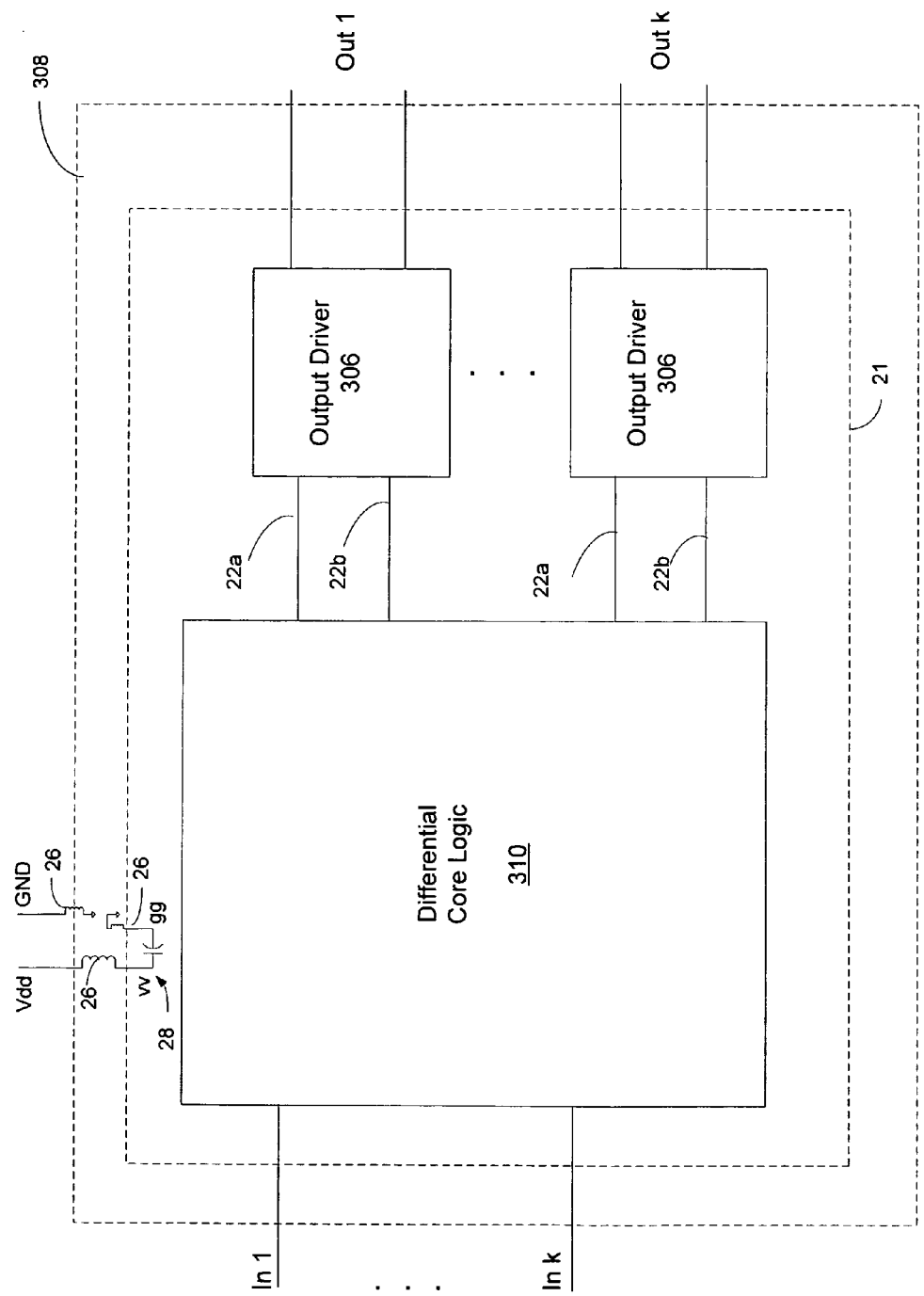
FIG. 30 depicts an integrated circuit according to yet another embodiment of the invention.

Referring now to FIG. 30, an integrated circuit 308 according to yet another embodiment of the invention is depicted. The integrated circuit 308 includes differential core logic 310, which may include, for instance, voltage-mode differential logic circuits designed according to the process of FIG. 24. The integrated circuit 308 further includes output drivers 306 for providing output signals.

According to the embodiment shown in FIG. 30, differential core logic 310 produces differential signals, which are provided to the output drivers 306. As described above, the output drivers 306 may be conventional differential drivers designed using conventional differential technologies such as HSTL, TTL, LVDS, LVPECL, etc. In another embodiment, an output driver 306 may simply be two inverter circuits such as inverters 432a-b of FIG. 4B.

In some embodiments, output drivers 306 may be conventional differential I/O drivers, and differential core logic 310 may accept single-ended inputs or differential inputs. A person of ordinary skill in the art having the benefit of the present disclosure would appreciate that may other variations are possible and all of which are within the scope of the present invention.

Embodiments of the invention have thus been disclosed. The foregoing descriptions of specific embodiments of the invention are presented for purposes of illustration and explanation. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. In other instances, well known structures and devices have not been illustrated or described in detail in order to avoid obscuring aspects of the invention. For example, decoupling capacitors (including on-board, on-chip, or both on-board and on-chip decoupling capacitors) which may be present in various embodiments of the invention are not illustrated. It is the claims, not merely the foregoing illustration, that are intended to define the exclusive rights of the invention.

Furthermore, throughout this specification (including the claims), unless the context requires otherwise, the word "comprise", or variations such as "comprises" or "comprising", will be understood to imply the inclusion of a stated element or group of elements but not the exclusion of any other element or group of elements. The word "include," or variations such as "includes" or "including," will be understood to imply the inclusion of a stated element or group of elements but not the exclusion of any other element or group of elements. Claims that do not contain the terms "means for" and "step for" are not intended to be construed under 35 U.S.C. §112, paragraph 6.

What is claimed is:

1. A method of designing a high speed circuit, comprising:
converting a logic-level schematic for a first circuit to a first transistor-level schematic;
combining the first transistor-level schematic with a second transistor-level schematic for a second circuit that is complementary to the first circuit, wherein the second circuit has a same number of nodes as the first circuit at transistor-level, wherein said first circuit and said second circuit are each coupled to a power supply node and a ground node, wherein said power supply node is connected to a first end of a decoupling capacitor, and wherein said ground node is connected to a second end of said decoupling capacitor; and
converting the combined transistor-level schematic to a logic-level schematic for a differential circuit.

2. The method of claim 1, wherein each node of the first circuit has a corresponding complementary node at the second circuit.

3. The method of claim 2, wherein a transition time of a node of the first circuit is approximately the same as a transition time of a corresponding complementary node of the second circuit.

4. The method of claim 2, wherein a trace length between two nodes of the first circuit is approximately the same as a trace length between two corresponding nodes of the second circuit.

5. The method of claim 2, wherein a current size at a node of the first circuit is approximately the same as a current size at a corresponding node of the second circuit.

6. The method of claim 1, wherein the first circuit comprises a digital logic circuit.

7. The method of claim 1, wherein the first circuit comprises an analog circuit.

8. The method of claim 1, wherein the first circuit comprises a mixed signal circuit.

9. An integrated circuit manufactured according to a process that comprises the design method of claim 1, 2, 3, 4, 5, 6, 7 or 8.

10. The integrated circuit of claim 9, wherein said decoupling capacitor is coupled to a power supply pin and a ground pin of the integrated circuit.

11. The integrated circuit according to claim 1, wherein the first and second circuits comprise a differential pre-driver circuit, wherein the differential pre-driver circuit comprises voltage mode differential logic gates.

12. A method of designing differential high speed circuits, comprising:
providing a first state machine comprising at least one non-differential cell;
replacing the at least one non-differential cell with an equivalent differential cell to produce a second state machine;
constructing a truth table for the second state machine; and
deriving state input equations for the second state machine according to the truth table.

13. The method of claim 12, wherein the second state machine has a larger number of states than the first state machine.

14. The method of claim 13, wherein the equivalent differential cell comprises at least twice as many nodes as the non-differential cell.

15. The method of claim 14, wherein at least half of the nodes of the differential cell are complementary to at least another half of the nodes.

16. A method of designing an integrated circuit comprising:
inter-linking a plurality of differential cells to form an integrated circuit pattern, wherein said plurality of differential cells are each coupled to a power supply node and a ground node, wherein said power supply node is connected to a first end of a decoupling capacitor, and wherein said ground node is connected to a second end of said decoupling capacitor.

17. The method according to claim 16, further comprising: fabricating said integrated circuit on a semiconductor wafer based on said integrated circuit pattern.

18. The method according to claim 16, wherein said integrated circuit comprises an I/O interface supporting an output frequency of at least 1 GHz.

19. The method according to claim 18, wherein said I/O interface supports an output voltage of at least 2 Volts.

20. The method according to claim 17, wherein said fabricating step further comprises fabricating said integrated circuit utilizing 0.35 μm CMOS technology.

21. The method according to claim 17, wherein said fabricating step further comprises implementing a plurality of transistors on said semiconductor wafer, wherein each of said transistor being configured without a current source.

* * * * *